United States Patent
Kim et al.

(10) Patent No.: US 11,056,768 B2
(45) Date of Patent: Jul. 6, 2021

(54) ELECTRONIC DEVICE COMPRISING ANTENNA

(71) Applicant: Samsung Electronics Co., Ltd., Gyeonggi-do (KR)

(72) Inventors: Hyeongtae Kim, Gyeonggi-do (KR); Seunggil Jeon, Gyeonggi-do (KR)

(73) Assignee: Samsung Electronics Co., Ltd

( * ) Notice: Subject to any disclaimer, the term of this patent is extended or adjusted under 35 U.S.C. 154(b) by 148 days.

(21) Appl. No.: 16/060,300

(22) PCT Filed: Nov. 14, 2016

(86) PCT No.: PCT/KR2016/013100
§ 371 (c)(1),
(2) Date: Jun. 7, 2018

(87) PCT Pub. No.: WO2017/099377
PCT Pub. Date: Jun. 15, 2017

(65) Prior Publication Data
US 2018/0366813 A1    Dec. 20, 2018

(30) Foreign Application Priority Data
Dec. 7, 2015 (KR) .................. 10-2015-0173203

(51) Int. Cl.
*H01Q 1/24*    (2006.01)
*H01Q 9/42*    (2006.01)
(Continued)

(52) U.S. Cl.
CPC ........... *H01Q 1/243* (2013.01); *H01Q 1/2266* (2013.01); *H01Q 1/24* (2013.01); *H01Q 1/38* (2013.01);
(Continued)

(58) Field of Classification Search
CPC ........ H01Q 1/243; H01Q 1/2226; H01Q 1/38; H01Q 1/24; H01Q 1/48; H01Q 9/04;
(Continued)

(56) References Cited

U.S. PATENT DOCUMENTS

2003/0045246 A1    3/2003  Lee et al.
2003/0117324 A1    6/2003  Iwai et al.
(Continued)

FOREIGN PATENT DOCUMENTS

CN    1447574    10/2003
CN    1671154    9/2005
(Continued)

OTHER PUBLICATIONS

European Search Report dated Aug. 10, 2018 issued in counterpart application No. 16873243.6-1205, 5 pages.
(Continued)

*Primary Examiner* — Awat M Salih
(74) *Attorney, Agent, or Firm* — The Farrell Law Firm, P.C.

(57) ABSTRACT

According to various examples, an electronic device comprising: a housing, which is a foldable housing and includes a first housing part including a first surface and a second surface oppositely facing the first surface, a second housing part including a first surface facing the first surface of the first housing part when folded in a first direction, and a second surface facing the second surface of the first housing part when folded in a second direction, and a connection part connecting the first housing part and the second housing part; a communication circuit disposed inside the housing; a first antenna pattern disposed inside the first housing part; a second antenna pattern disposed inside the second housing part; a first display exposed to the first surface of the first housing part; a second display exposed to the first surface of
(Continued)

the second housing part; a first conductive member exposed to the second surface of the first housing part, and electrically connected to the first antenna pattern; and a second conductive member exposed to the second surface of the second housing part, and electrically connected to the second antenna pattern, wherein the communication circuit is electrically connected to the first antenna pattern and/or the second antenna pattern, and the first conductive member and the second conductive member can be electrically connected or coupled with each other, when the housing is folded in the second direction.

18 Claims, 16 Drawing Sheets

(51) Int. Cl.
  *H01Q 1/38* (2006.01)
  *H01Q 9/04* (2006.01)
  *H01Q 1/22* (2006.01)
  *H04M 1/02* (2006.01)
  *H05K 5/00* (2006.01)
  *H01Q 1/48* (2006.01)
  *H01Q 21/00* (2006.01)

(52) U.S. Cl.
  CPC ............... *H01Q 1/48* (2013.01); *H01Q 9/04* (2013.01); *H01Q 9/42* (2013.01); *H01Q 21/00* (2013.01); *H04M 1/02* (2013.01); *H04M 1/0216* (2013.01); *H04M 1/0266* (2013.01); *H05K 5/00* (2013.01); *H04M 1/0268* (2013.01)

(58) Field of Classification Search
  CPC ............ H01Q 9/42; H01Q 21/00; H05K 5/00; H04M 1/02; H04M 1/0266; H04M 1/0216; H04M 1/0268
  See application file for complete search history.

(56) References Cited

U.S. PATENT DOCUMENTS

| | | |
|---|---|---|
| 2003/0148784 A1 | 8/2003 | Sawamura et al. |
| 2004/0063476 A1 | 4/2004 | Katagishi et al. |
| 2005/0277398 A1 | 12/2005 | Son |
| 2008/0081657 A1 | 4/2008 | Suzuki et al. |
| 2009/0131125 A1 | 5/2009 | Hirai |
| 2010/0013720 A1 | 1/2010 | Sakata et al. |
| 2010/0245186 A1 | 9/2010 | Kojima |
| 2012/0050975 A1* | 3/2012 | Garelli ............... G06F 1/1615 361/679.27 |
| 2013/0259486 A1* | 10/2013 | Chi ................... H01Q 1/243 398/115 |
| 2013/0321219 A1* | 12/2013 | Cho ................... H01Q 9/0421 343/702 |
| 2014/0152576 A1* | 6/2014 | Kim ................... G06F 1/1677 345/169 |
| 2014/0198010 A1* | 7/2014 | Cheng ................ H01Q 7/00 343/866 |
| 2015/0171916 A1 | 6/2015 | Asrani et al. |

FOREIGN PATENT DOCUMENTS

| | | |
|---|---|---|
| CN | 1756098 | 4/2006 |
| CN | 101107835 | 1/2008 |
| CN | 101897080 | 11/2010 |
| JP | 2004-201179 | 7/2004 |
| JP | 2006-332792 | 12/2006 |
| JP | 2008-227560 | 9/2008 |
| KR | 1020030034007 | 5/2003 |
| KR | 1020100084757 | 7/2010 |
| KR | 1020130062210 | 6/2013 |

OTHER PUBLICATIONS

PCT/ISA/210 Search Report issued on PCT/KR2016/013100 (pp. 3).
PCT/ISA/237 Written Opinion issued on PCT/KR2016/013100 (pp. 4).
Chinese Office Action dated Nov. 28, 2019 issued in counterpart application No. 201680068754.8, 9 pages.

\* cited by examiner

⟨591⟩

⟨660⟩

ELECTRONIC DEVICE COMPRISING ANTENNA

PRIORITY

This application is a National Phase Entry of PCT International Application No. PCT/KR2016/013100 which was filed on Nov. 14, 2016, and claims priority to Korean Patent Application No. 10-2015-0173203, which was filed on Dec. 7, 2015, the content of each of which is incorporated herein by reference.

TECHNICAL FIELD

Various embodiments of the present disclosure relate to an electronic device including an antenna.

BACKGROUND ART

Electronic devices are being launched in various structures. For example, an electronic device may be formed in a bendable structure or a foldable structure. As another example, an electronic device may include a flip cover, a dual display, a flexible display, and the like.

An electronic device having a communication function can provide a mobile communication service through an antenna. The antenna may be disposed at a portion of the interior and/or exterior of the housing of the electronic device. For example, the antenna may be formed in a pattern on a printed circuit board (PCB).

DISCLOSURE OF INVENTION

Technical Problem

The antenna may be located inside the electronic device, and the housing of the electronic device may be formed of a metal frame which is a conductive material. For example, a signal transmitted to the outside from the antenna located inside the electronic device may be distorted or blocked at least partially by the metal frame, thereby causing the degradation of antenna radiation performance.

As the antenna is located inside the electronic device, a space inside the housing of the electronic device in which the antenna is mounted may be limited. Moreover, when the electronic device is reduced in size, the space inside the housing may be further limited. In addition, when the frequency band supported by the antenna is variable, the space inside the housing may be further limited because a plurality of antennas or a complex-shaped antenna should be disposed.

Accordingly, various embodiments of the present disclosure propose an electronic device including an antenna that is not limited to a space inside the electronic device and does not deteriorate antenna radiation performance by a conductive material.

Solution to Problem

According to various embodiments, an electronic device may comprise a foldable housing including a first housing part including a first surface and a second surface opposite to the first surface, a second housing part including a first surface facing the first surface of the first housing part when folded in a first direction, and a second surface facing the second surface of the first housing part when folded in a second direction, and a connection part connecting the first housing part and the second housing part; a communication circuit disposed inside the housing; a first antenna pattern disposed inside the first housing part; a second antenna pattern disposed inside the second housing part; a first display exposed to the first surface of the first housing part; a second display exposed to the first surface of the second housing part; a first conductive member exposed to the second surface of the first housing part, and electrically connected to the first antenna pattern; and a second conductive member exposed to the second surface of the second housing part, and electrically connected to the second antenna pattern, wherein the communication circuit is electrically connected to the first antenna pattern and/or the second antenna pattern, and wherein the first conductive member and the second conductive member are electrically connected to or coupling with each other when the housing is folded in the second direction.

According to various embodiments, an electronic device may comprise a housing including a first surface and a second surface opposite to the first surface; a communication circuit disposed inside the housing; at least one first conductive member exposed to a portion of the second surface of the housing; at least one second conductive member exposed to another portion of the second surface of the housing; a first antenna pattern disposed inside the housing and electrically connected to the first conductive member; and a second antenna pattern disposed inside the housing and electrically connected to the second conductive member, wherein the communication circuit is electrically connected to the first antenna pattern and/or the second antenna pattern, wherein when folded in a first direction, at least a portion of the first surface meets at least another portion of the first surface, and wherein when folded in a second direction, at least a portion of the second surface meets at least another portion of the second surface, and the first conductive member and the second conductive member are electrically connected to or coupling with each other.

Advantageous Effects of Invention

According to various embodiments of the present disclosure, an electronic device including an antenna can efficiently utilize an internal space. Further, according to various embodiments of the present disclosure, an electronic device including an antenna can maintain antenna performance without the deterioration of the antenna performance by a conductive material.

MODE FOR THE INVENTION

Figure 1:
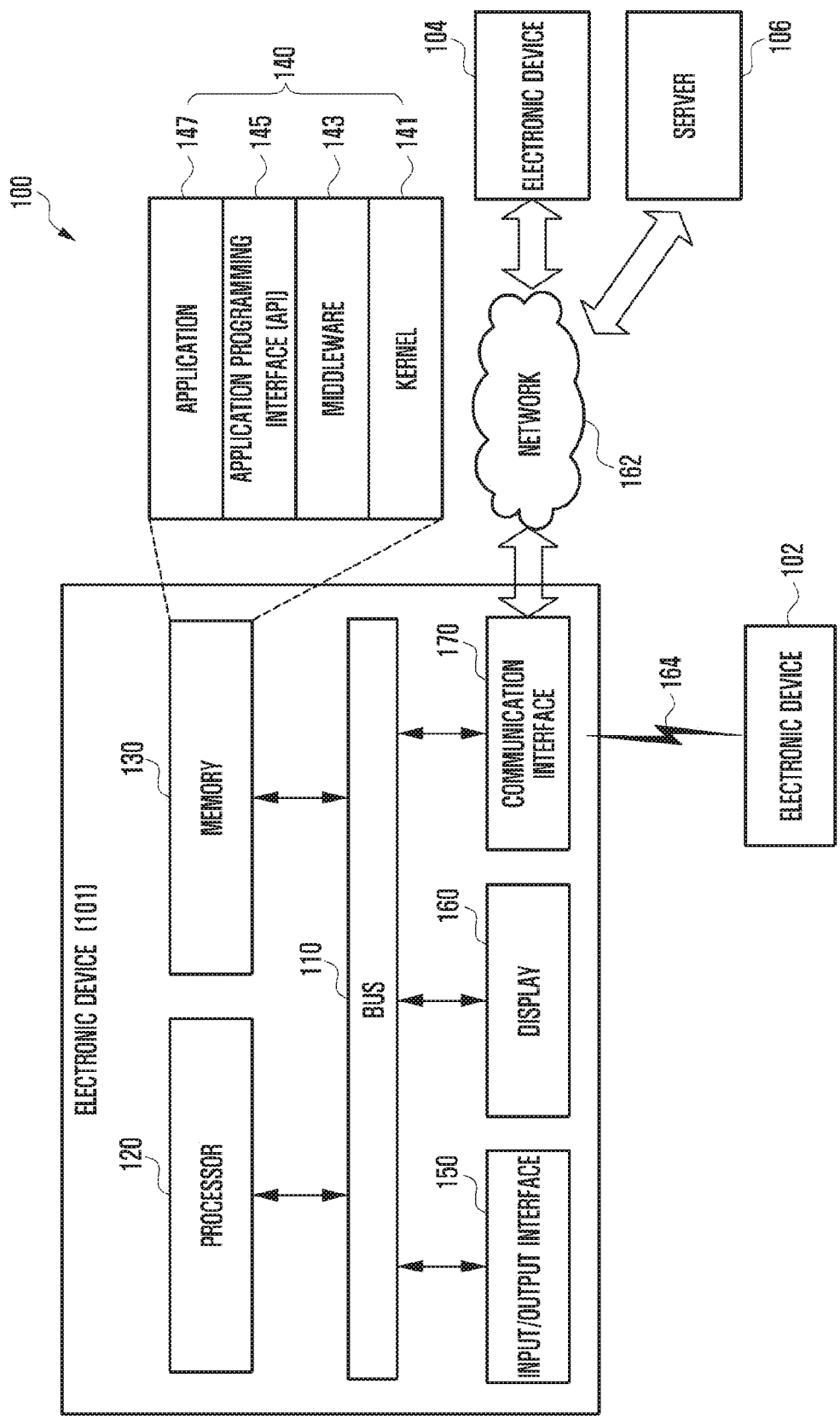
FIG. 1 is a block diagram illustrating the configuration of an electronic device according to various embodiments of the present disclosure.

The expressions such as "include" and "may include" which may be used in the present disclosure denote the presence of the disclosed functions, operations, and constituent elements and do not limit one or more additional functions, operations, and constituent elements. In the present disclosure, the terms such as "include" and/or "have" may be construed to denote a certain characteristic, number, step, operation, constituent element, component or a combination thereof, but may not be construed to exclude the existence of or a possibility of addition of one or more other characteristics, numbers, steps, operations, constituent elements, components or combinations thereof.

Furthermore, in the present disclosure, the expression "and/or" includes any and all combinations of the associated listed words. For example, the expression "A and/or B" may include A, may include B, or may include both A and B.

In the present disclosure, expressions including ordinal numbers, such as "first"and "second," etc., may modify various elements. However, such elements are not limited by the above expressions. For example, the above expressions do not limit the sequence and/or importance of the elements. The above expressions are used merely for the purpose to distinguish an element from the other elements. For example, a first user device and a second user device indicate different user devices although both of them are user devices. For example, a first element could be termed a second element, and similarly, a second element could be also termed a first element without departing from the scope of the present disclosure.

In the case where a component is referred to as being "connected" or "accessed" to other component, it should be understood that not only the component is directly connected or accessed to the other component, but also there may exist another component between them. Meanwhile, in the case where a component is referred to as being "directly connected" or "directly accessed" to other component, it should be understood that there is no component therebetween. The terms used in the present disclosure are only used to describe specific various embodiments, and are not intended to limit the present disclosure. As used herein, the singular forms are intended to include the plural forms as well, unless the context clearly indicates otherwise. Singular forms are intended to include plural forms unless the context clearly indicates otherwise.

An electronic device according to the present disclosure may be a device including a communication function. For example, the device corresponds to a combination of at least one of a smartphone, a tablet Personal Computer (PC), a mobile phone, a video phone, an e-book reader, a desktop PC, a laptop PC, a netbook computer, a Personal Digital Assistant (PDA), a Portable Multimedia Player (PMP), adigital audio player, a mobile medical device, an electronic bracelet, an electronic necklace, an electronic accessory, a camera, a wearable device, an electronic clock, a wrist watch, home appliances (for example, an air-conditioner, vacuum, an oven, a microwave, a washing machine, an air cleaner, and the like), an artificial intelligence robot, a TeleVision (TV), a Digital Video Disk (DVD) player, an audio device, various medical devices (for example, Magnetic Resonance Angiography (MRA), Magnetic Resonance Imaging (MRI), Computed Tomography (CT), a scanning machine, a ultrasonic wave device, or the like), a navigation device, a Global Positioning System (GPS) receiver, an Event Data Recorder (EDR), a Flight Data Recorder (FDR), a set-top box, a TV box (for example, Samsung HomeSync™, Apple TV™, or Google TV™), an electronic dictionary, vehicle infotainment device, an electronic equipment for a ship (for example, navigation equipment for a ship, gyrocompass, or the like), avionics, a security device, electronic clothes, an electronic key, a camcorder, game consoles, a Head-Mounted Display (HMD), a flat panel display device, an electronic frame, an electronic album, furniture or a portion of a building/structure that includes a communication function, an electronic board, an electronic signature receiving device, a projector, and the like. It is obvious to those skilled in the art that the electronic device according to the present disclosure is not limited to the aforementioned devices.

FIG. 1 is a block diagram illustrating a configuration of an electronic device according to an embodiment of the present disclosure.

Referring to FIG. 1, the electronic device 100 may include a bus 110, a processor 120, a memory 130, a user input module 140, a display module 150, a communication module 160, and other similar and/or suitable components.

The bus 110 may be a circuit which interconnects the above-described elements and delivers a communication (e.g., a control message) between the above-described elements.

The processor 120 may receive commands from the above-described other elements (e.g., the memory 130, the user input module 140, the display module 150, the communication module 160, etc.) through the bus 110, may interpret the received commands, and may execute calculation or data processing according to the interpreted commands.

The memory 130 may store commands or data received from the processor 120 or other elements (e.g., the user input module 140, the display module 150, the communication module 160, etc.) or generated by the processor 120 or the other elements. The memory 130 may include programming modules, such as a kernel 131, middleware 132, an Application Programming Interface (API) 133, an application 134, and the like. Each of the above-described programming modules may be implemented in software, firmware, hardware, or a combination of two or more thereof.

The kernel 131 may control or manage system resources (e.g., the bus 110, the processor 120, the memory 130, etc.) used to execute operations or functions implemented by other programming modules (e.g., the middleware 132, the API 133, and the application 134). Also, the kernel 131 may provide an interface capable of accessing and controlling or managing the individual elements of the electronic device 100 by using the middleware 132, the API 133, or the application 134.

The middleware 132 may serve to go between the API 133 or the application 134 and the kernel 131 in such a manner that the API 133 or the application 134 communicates with the kernel 131 and exchanges data therewith. Also, in relation to work requests received from one or more applications 134 and/or the middleware 132, for example, may perform load balancing of the work requests by using a method of assigning a priority, in which system resources (e.g., the bus 110, the processor 120, the memory 130, etc.)

of the electronic device 100 can be used, to at least one of the one or more applications 134.

The API 133 is an interface through which the application 134 is capable of controlling a function provided by the kernel 131 or the middleware 132, and may include, for example, at least one interface or function for file control, window control, image processing, character control, or the like.

The user input module 140, for example, may receive a command or data as input from a user, and may deliver the received command or data to the processor 120 or the memory 130 through the bus 110. The display module 150 may display a video, an image, data, or the like to the user.

The communication module 160 may connect communication between another electronic device 102 and the electronic device 100. The communication module 160 may support a predetermined short-range communication protocol (e.g., Wi-Fi, BlueTooth (BT), and Near Field Communication (NFC)), or predetermined network communication 162 (e.g., the Internet, a Local Area Network (LAN), a Wide Area Network (WAN), a telecommunication network, a cellular network, a satellite network, a Plain Old Telephone Service (POTS), or the like). Each of the electronic devices 102 and 104 may be a device which is identical (e.g., of an identical type) to or different (e.g., of a different type) from the electronic device 100. Further, the communication module 160 may connect communication between a server 164 and the electronic device 100 via the network 162.

Figure 2:
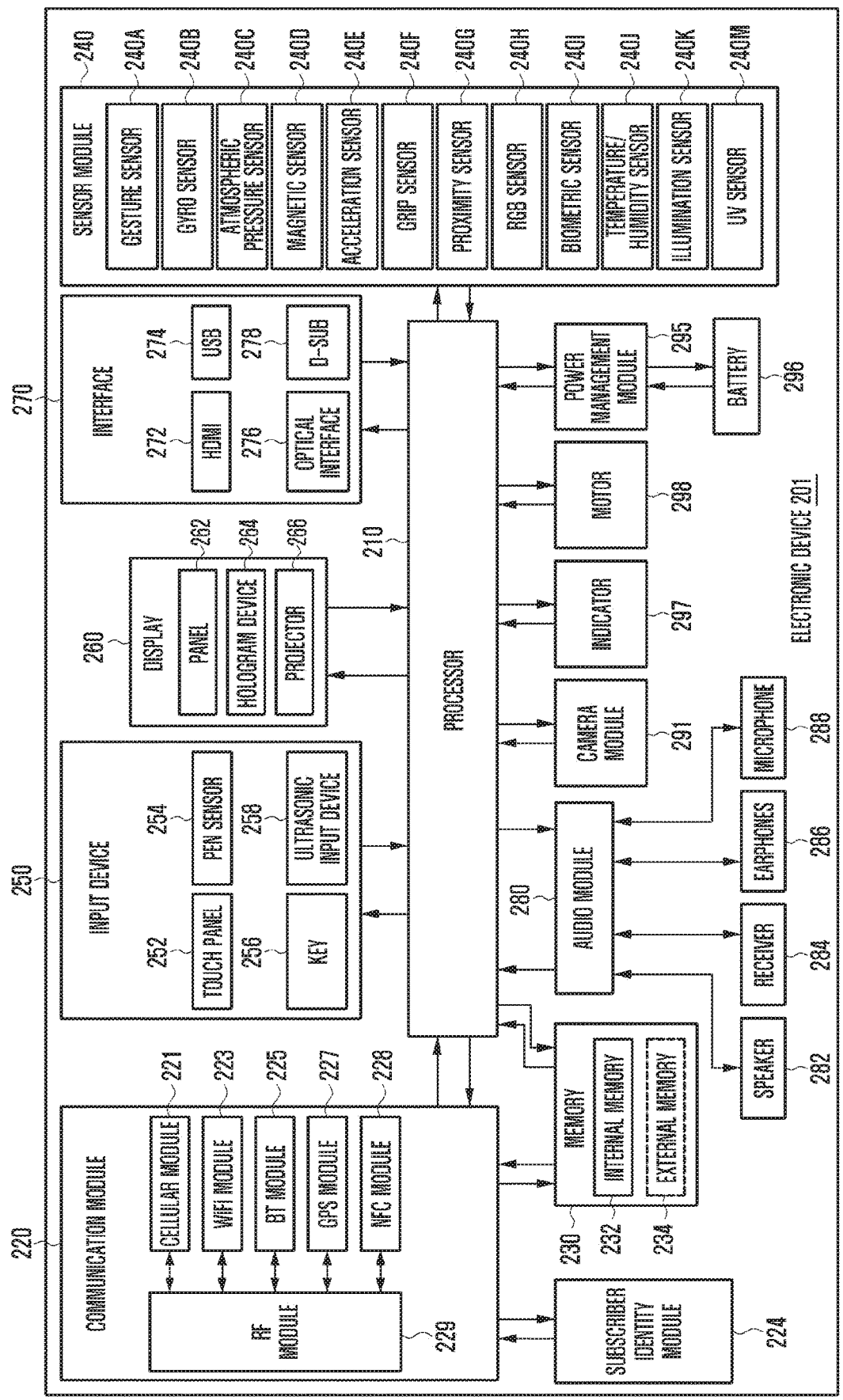
FIG. 2 is a block diagram of an electronic device according to various embodiments of the present disclosure.

FIG. 2 is a block diagram illustrating a configuration of hardware 200 according to an embodiment of the present disclosure.

The hardware 200 may be, for example, the electronic device 100 illustrated in FIG. 1.

Referring to FIG. 2, the hardware 200 may include one or more processors 210, a Subscriber Identification Module (SIM) card 214, a memory 220, a communication module 230, a sensor module 240, a user input module 250, a display module 260, an interface 270, an audio coder/decoder (codec) 280, a camera module 291, a power management module 295, a battery 296, an indicator 297, a motor 298 and any other similar and/or suitable components.

The processor 210 (e.g., the processor 120) may include one or more Application Processors (APs) 211, or one or more Communication Processors (CPs) 213. The processor 210 may be, for example, the processor 120 illustrated in FIG. 1. The AP 211 and the CP 213 are illustrated as being included in the processor 210 in FIG. 2, but may be included in different Integrated Circuit (IC) packages, respectively. According to an embodiment of the present disclosure, the AP 211 and the CP 213 may be included in one IC package.

The AP 211 may execute an Operating System (OS) or an application program, and thereby may control multiple hardware or software elements connected to the AP 211 and may perform processing of and arithmetic operations on various data including multimedia data. The AP 211 may be implemented by, for example, a System on Chip (SoC). According to an embodiment of the present disclosure, the processor 210 may further include a Graphical Processing Unit (GPU) (not illustrated).

The CP 213 may manage a data line and may convert a communication protocol in the case of communication between the electronic device (e.g., the electronic device 100) including the hardware 200 and different electronic devices connected to the electronic device through the network. The CP 213 may be implemented by, for example, a SoC. According to an embodiment of the present disclosure, the CP 213 may perform at least some of multimedia control functions. The CP 213, for example, may distinguish and authenticate a terminal in a communication network by using a subscriber identification module (e.g., the SIM card 214). Also, the CP 213 may provide the user with services, such as a voice telephony call, a video telephony call, a text message, packet data, and the like.

Further, the CP 213 may control the transmission and reception of data by the communication module 230. In FIG. 2, the elements such as the CP 213, the power management module 295, the memory 220, and the like are illustrated as elements separate from the AP 211. However, according to an embodiment of the present disclosure, the AP 211 may include at least some (e.g., the CP 213) of the above-described elements.

According to an embodiment of the present disclosure, the AP 211 or the CP 213 may load, to a volatile memory, a command or data received from at least one of a non-volatile memory and other elements connected to each of the AP 211 and the CP 213, and may process the loaded command or data. Also, the AP 211 or the CP 213 may store, in a non-volatile memory, data received from or generated by at least one of the other elements.

The SIM card 214 may be a card implementing a subscriber identification module, and may be inserted into a slot formed in a particular portion of the electronic device 100. The SIM card 214 may include unique identification information (e.g., Integrated Circuit Card IDentifier (ICCID)) or subscriber information (e.g., International Mobile Subscriber Identity (IMSI)).

The memory 220 may include an internal memory 222 and an external memory 224. The memory 220 may be, for example, the memory 130 illustrated in FIG. 1. The internal memory 222 may include, for example, at least one of a volatile memory (e.g., a Dynamic RAM (DRAM), a Static RAM (SRAM), a Synchronous Dynamic RAM (SDRAM), etc.), and a non-volatile memory (e.g., a One Time Programmable ROM (OTPROM), a Programmable ROM (PROM), an Erasable and Programmable ROM (EPROM), an Electrically Erasable and Programmable ROM (EEPROM), a mask ROM, a flash ROM, a Not AND (NAND) flash memory, a Not OR (NOR) flash memory, etc.). According to an embodiment of the present disclosure, the internal memory 222 may be in the form of a Solid State Drive (SSD). The external memory 224 may further include a flash drive, for example, a Compact Flash (CF), a Secure Digital (SD), a Micro-Secure Digital (Micro-SD), a Mini-Secure Digital (Mini-SD), an extreme Digital (xD), a memory stick, or the like.

The communication module 230 may include a wireless communication module 231 or a Radio Frequency (RF) module 234. The communication module 230 may be, for example, the communication module 160 illustrated in FIG. 1. The wireless communication module 231 may include, for example, a Wi-Fi part 233, a BT part 235, a GPS part 237, or a NFC part 239. For example, the wireless communication module 231 may provide a wireless communication function by using a radio frequency. Additionally or alternatively, the wireless communication module 231 may include a network interface (e.g., a LAN card), a modulator/demodulator (modem), or the like for connecting the hardware 200 to a network (e.g., the Internet, a LAN, a WAN, a telecommunication network, a cellular network, a satellite network, a POTS, or the like).

The RF module 234 may be used for transmission and reception of data, for example, transmission and reception of RF signals or called electronic signals. Although not illustrated, the RF unit 234 may include, for example, a transceiver, a Power Amplifier Module (PAM), a frequency filter, a Low Noise Amplifier (LNA), or the like. Also, the RF module 234 may further include a component for transmitting and receiving electromagnetic waves in a free space in a wireless communication, for example, a conductor, a conductive wire, or the like.

The sensor module 240 may include, for example, at least one of a gesture sensor 240A, a gyro sensor 240B, an atmospheric pressure sensor 240C, a magnetic sensor 240D, an acceleration sensor 240E, a grip sensor 240F, a proximity sensor 240G, a Red, Green and Blue (RGB) sensor 240H, a biometric sensor 2401, a temperature/humidity sensor 240J, an illuminance sensor 240K, and a Ultra Violet (UV) sensor 240M. The sensor module 240 may measure a physical quantity or may sense an operating state of the electronic device 100, and may convert the measured or sensed information to an electrical signal. Additionally/alternatively, the sensor module 240 may include, for example, an E-nose sensor (not illustrated), an ElectroMyoGraphy (EMG) sensor (not illustrated), an ElectroEncephaloGram (EEG) sensor (not illustrated), an ElectroCardioGram (ECG) sensor (not illustrated), a fingerprint sensor (not illustrated), and the like. Additionally or alternatively, the sensor module 240 may include, for example, an E-nose sensor (not illustrated), an EMG sensor (not illustrated), an EEG sensor (not illustrated), an ECG sensor (not illustrated), a fingerprint sensor, and the like. The sensor module 240 may further include a control circuit (not illustrated) for controlling one or more sensors included therein.

The user input module 250 may include a touch panel 252, a pen sensor 254 (e.g., a digital pen sensor), keys 256, and an ultrasonic input unit 258. The user input module 250 may be, for example, the user input module 140 illustrated in FIG. 1. The touch panel 252 may recognize a touch input in at least one of, for example, a capacitive scheme, a resistive scheme, an infrared scheme, and an acoustic wave scheme. Also, the touch panel 252 may further include a controller (not illustrated). In the capacitive type, the touch panel 252 is capable of recognizing proximity as well as a direct touch. The touch panel 252 may further include a tactile layer (not illustrated). In this event, the touch panel 252 may provide a tactile response to the user.

The pen sensor 254 (e.g., a digital pen sensor), for example, may be implemented by using a method identical or similar to a method of receiving a touch input from the user, or by using a separate sheet for recognition. For example, a key pad or a touch key may be used as the keys 256. The ultrasonic input unit 258 enables the terminal to sense a sound wave by using a microphone (e.g., a microphone 288) of the terminal through a pen generating an ultrasonic signal, and to identify data. The ultrasonic input unit 258 is capable of wireless recognition. According to an embodiment of the present disclosure, the hardware 200 may receive a user input from an external device (e.g., a network, a computer, or a server), which is connected to the communication module 230, through the communication module 230.

The display module 260 may include a panel 262 or a hologram 264. The display module 260 may be, for example, the display module 150 illustrated in FIG. 1. The panel 262 may be, for example, a Liquid Crystal Display (LCD) and an Active Matrix Organic Light Emitting Diode (AM-OLED) display, and the like. The panel 262 may be implemented so as to be, for example, flexible, transparent, or wearable. The panel 262 may include the touch panel 252 and one module. The hologram 264 may display a three-dimensional image in the air by using interference of light.

According to an embodiment of the present disclosure, the display module 260 may further include a control circuit for controlling the panel 262 or the hologram 264.

The interface 270 may include, for example, a High-Definition Multimedia Interface (HDMI) 272, a Universal Serial Bus (USB) 274, a projector 276, and a D-subminiature (D-sub) 278. Additionally or alternatively, the interface 270 may include, for example, SD/Multi-Media Card (MMC) (not illustrated) or Infrared Data Association (IrDA) (not illustrated).

The audio codec 280 may bidirectionally convert between a voice and an electrical signal. The audio codec 280 may convert voice information, which is input to or output from the audio codec 280, through, for example, a speaker 282, a receiver 284, an earphone 286, the microphone 288 or the like.

The camera module 291 may capture an image and a moving image. According to an embodiment, the camera module 291 may include one or more image sensors (e.g., a front lens or a back lens), an Image Signal Processor (ISP) (not illustrated), and a flash LED (not illustrated).

The power management module 295 may manage power of the hardware 200. Although not illustrated, the power management module 295 may include, for example, a Power Management Integrated Circuit (PMIC), a charger Integrated Circuit (IC), or a battery fuel gauge.

The PMIC may be mounted to, for example, an IC or a SoC semiconductor. Charging methods may be classified into a wired charging method and a wireless charging method. The charger IC may charge a battery, and may prevent an overvoltage or an overcurrent from a charger to the battery. According to an embodiment of the present disclosure, the charger IC may include a charger IC for at least one of the wired charging method and the wireless charging method. Examples of the wireless charging method may include a magnetic resonance method, a magnetic induction method, an electromagnetic method, and the like. Additional circuits (e.g., a coil loop, a resonance circuit, a rectifier, etc.) for wireless charging may be added in order to perform the wireless charging.

The battery fuel gauge may measure, for example, a residual quantity of the battery 296, or a voltage, a current or a temperature during the charging. The battery 296 may supply power by generating electricity, and may be, for example, a rechargeable battery.

The indicator 297 may indicate particular states of the hardware 200 or a part (e.g., the AP 211) of the hardware 200, for example, a booting state, a message state, a charging state and the like. The motor 298 may convert an electrical signal into a mechanical vibration. The processor 210 may control the sensor module 240.

Although not illustrated, the hardware 200 may include a processing unit (e.g., a GPU) for supporting a module TV. The processing unit for supporting a module TV may process media data according to standards such as, for example, Digital Multimedia Broadcasting (DMB), Digital Video Broadcasting (DVB), media flow, and the like. Each of the above-described elements of the hardware 200 according to an embodiment of the present disclosure may include one or more components, and the name of the relevant element may change depending on the type of electronic device. The hardware 200 according to an embodiment of the present disclosure may include at least one of the above-described elements. Some of the above-described elements may be omitted from the hardware 200, or the hardware 200 may further include additional elements. Also, some of the elements of the hardware 200 according to an embodiment of the present disclosure may be combined into one entity, which may perform functions identical to those of the relevant elements before the combination.

The term "module" used in the present disclosure may refer to, for example, a unit including one or more combinations of hardware, software, and firmware. The "module" may be interchangeable with a term, such as "unit," "logic," "logical block," "component," "circuit," or the like. The "module" may be a minimum unit of a component formed as one body or a part thereof. The "module" may be a minimum unit for performing one or more functions or a part thereof. The "module" may be implemented mechanically or electronically. For example, the "module" according to an embodiment of the present disclosure may include at least one of an Application-Specific Integrated Circuit (ASIC) chip, a Field-Programmable Gate Array (FPGA), and a programmable-logic device for performing certain operations which have been known or are to be developed in the future.

Figure 3:
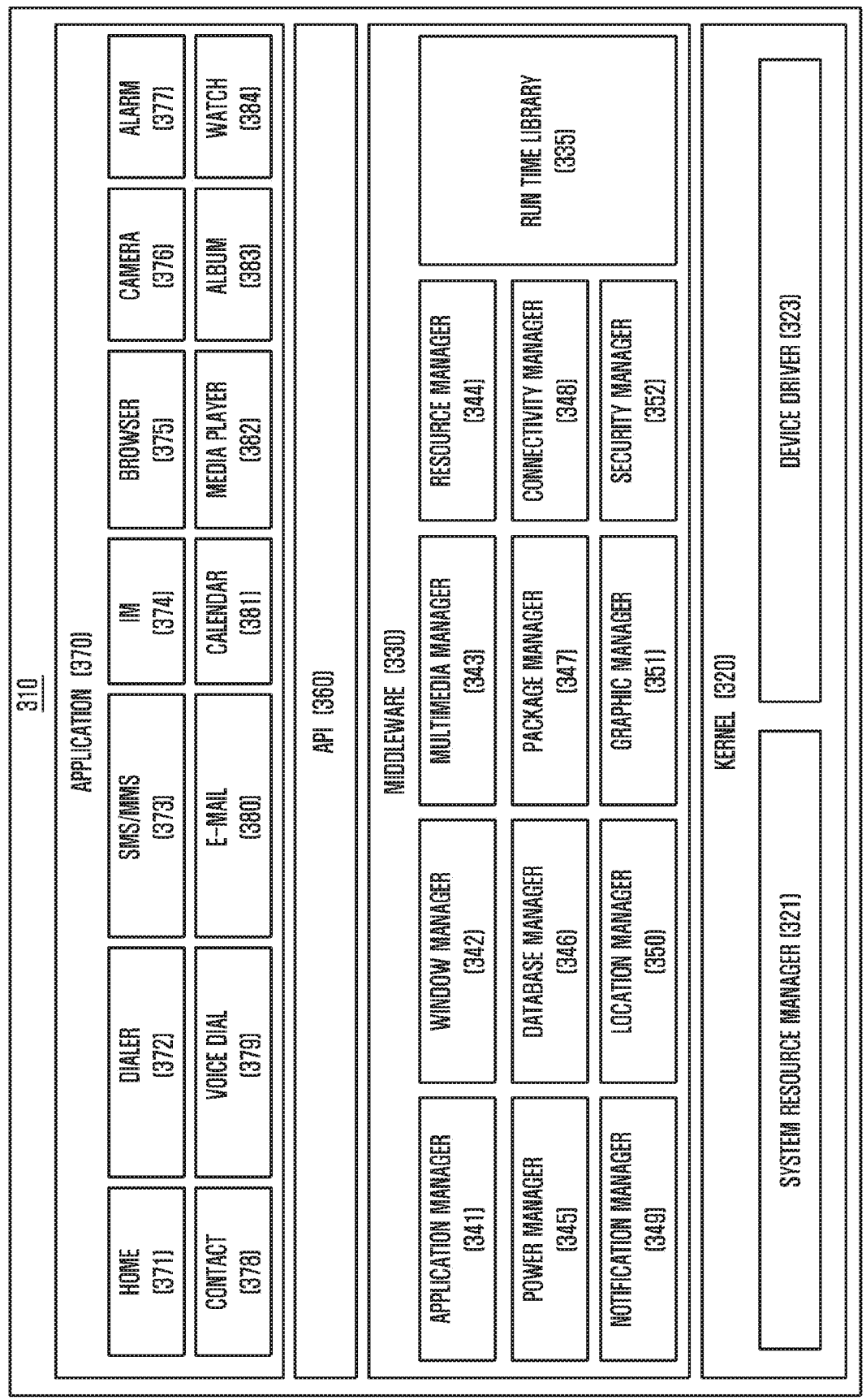
FIG. 3 is a block diagram of a program module according to various embodiments of the present disclosure.

FIG. 3 is a block diagram illustrating a configuration of a programming module 300 according to an embodiment of the present disclosure.

The programming module 300 may be included (or stored) in the electronic device 100 (e.g., the memory 130) or may be included (or stored) in the electronic device 200 (e.g., the memory 230) illustrated in FIG. 1. At least a part of the programming module 300 may be implemented in software, firmware, hardware, or a combination of two or more thereof. The programming module 300 may be implemented in hardware (e.g., the hardware 200), and may include an OS controlling resources related to an electronic device (e.g., the electronic device 100) and/or various applications (e.g., an application 370) executed in the OS. For example, the OS may be Android, iOS, Windows, Symbian, Tizen, Bada, and the like.

Referring to FIG. 3, the programming module 300 may include a kernel 310, a middleware 330, an API 360, and/or the application 370.

The kernel 310 (e.g., the kernel 131) may include a system resource manager 311 and/or a device driver 312. The system resource manager 311 may include, for example, a process manager (not illustrated), a memory manager (not illustrated), and a file system manager (not illustrated). The system resource manager 311 may perform the control, allocation, recovery, and/or the like of system resources. The device driver 312 may include, for example, a display driver (not illustrated), a camera driver (not illustrated), a Bluetooth driver (not illustrated), a shared memory driver (not illustrated), a USB driver (not illustrated), a keypad driver (not illustrated), a Wi-Fi driver (not illustrated), and/or an audio driver (not illustrated). Also, according to an embodiment of the present disclosure, the device driver 312 may include an Inter-Process Communication (IPC) driver (not illustrated).

The middleware 330 may include multiple modules previously implemented so as to provide a function used in common by the applications 370. Also, the middleware 330 may provide a function to the applications 370 through the API 360 in order to enable the applications 370 to efficiently use limited system resources within the electronic device. For example, as illustrated in FIG. 3, the middleware 330 (e.g., the middleware 132) may include at least one of a runtime library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, a security manager 352, and any other suitable and/or similar manager.

The runtime library 335 may include, for example, a library module used by a complier, in order to add a new function by using a programming language during the execution of the application 370. According to an embodiment of the present disclosure, the runtime library 335 may perform functions which are related to input and output, the management of a memory, an arithmetic function, and/or the like.

The application manager 341 may manage, for example, a life cycle of at least one of the applications 370. The window manager 342 may manage GUI resources used on the screen. The multimedia manager 343 may detect a format used to reproduce various media files and may encode or decode a media file through a codec appropriate for the relevant format. The resource manager 344 may manage resources, such as a source code, a memory, a storage space, and/or the like of at least one of the applications 370.

The power manager 345 may operate together with a Basic Input/Output System (BIOS), may manage a battery or power, and may provide power information and the like used for an operation. The database manager 346 may manage a database in such a manner as to enable the generation, search and/or change of the database to be used by at least one of the applications 370. The package manager 347 may manage the installation and/or update of an application distributed in the form of a package file.

The connectivity manager 348 may manage a wireless connectivity such as, for example, Wi-Fi and Bluetooth. The notification manager 349 may display or report, to the user, an event such as an arrival message, an appointment, a proximity alarm, and the like in such a manner as not to disturb the user. The location manager 350 may manage location information of the electronic device. The graphic manager 351 may manage a graphic effect, which is to be provided to the user, and/or a user interface related to the graphic effect. The security manager 352 may provide various security functions used for system security, user authentication, and the like. According to an embodiment of the present disclosure, when the electronic device (e.g., the electronic device 100) has a telephone function, the middleware 330 may further include a telephony manager (not illustrated) for managing a voice telephony call function and/or a video telephony call function of the electronic device.

The middleware 330 may generate and use a new middleware module through various functional combinations of the above-described internal element modules. The middleware 330 may provide modules specialized according to types of OSs in order to provide differentiated functions. Also, the middleware 330 may dynamically delete some of the existing elements, or may add new elements. Accordingly, the middleware 330 may omit some of the elements described in the various embodiments of the present disclosure, may further include other elements, or may replace the some of the elements with elements, each of which performs a similar function and has a different name.

The API 360 (e.g., the API 133) is a set of API programming functions, and may be provided with a different configuration according to an OS. In the case of Android or iOS, for example, one API set may be provided to each platform. In the case of Tizen, for example, two or more API sets may be provided to each platform.

The applications 370 (e.g., the applications 134) may include, for example, a preloaded application and/or a third party application. The applications 370 (e.g., the applications 134) may include, for example, a home application 371, a dialer application 372, a Short Message Service (SMS)/Multimedia Message Service (MMS) application 373, an Instant Message (IM) application 374, a browser application 375, a camera application 376, an alarm application 377, a contact application 378, a voice dial application 379, an electronic mail (e-mail) application 380, a calendar application 381, a media player application 382, an album application 383, a clock application 384, and any other suitable and/or similar application.

At least a part of the programming module 300 may be implemented by instructions stored in a non-transitory computer-readable storage medium. When the instructions are executed by one or more processors (e.g., the one or more processors 210), the one or more processors may perform functions corresponding to the instructions. The non-transitory computer-readable storage medium may be, for example, the memory 220. At least a part of the programming module 300 may be implemented (e.g., executed) by, for example, the one or more processors 210. At least a part of the programming module 300 may include, for example, a module, a program, a routine, a set of instructions, and/or a process for performing one or more functions.

Names of the elements of the programming module (e.g., the programming module 300) according to an embodiment of the present disclosure may change depending on the type of OS. The programming module according to an embodiment of the present disclosure may include one or more of the above-described elements. Alternatively, some of the above-described elements may be omitted from the programming module. Alternatively, the programming module may further include additional elements. The operations performed by the programming module or other elements according to an embodiment of the present disclosure may be processed in a sequential method, a parallel method, a repetitive method, or a heuristic method. Also, some of the operations may be omitted, or other operations may be added to the operations.

Figure 4:
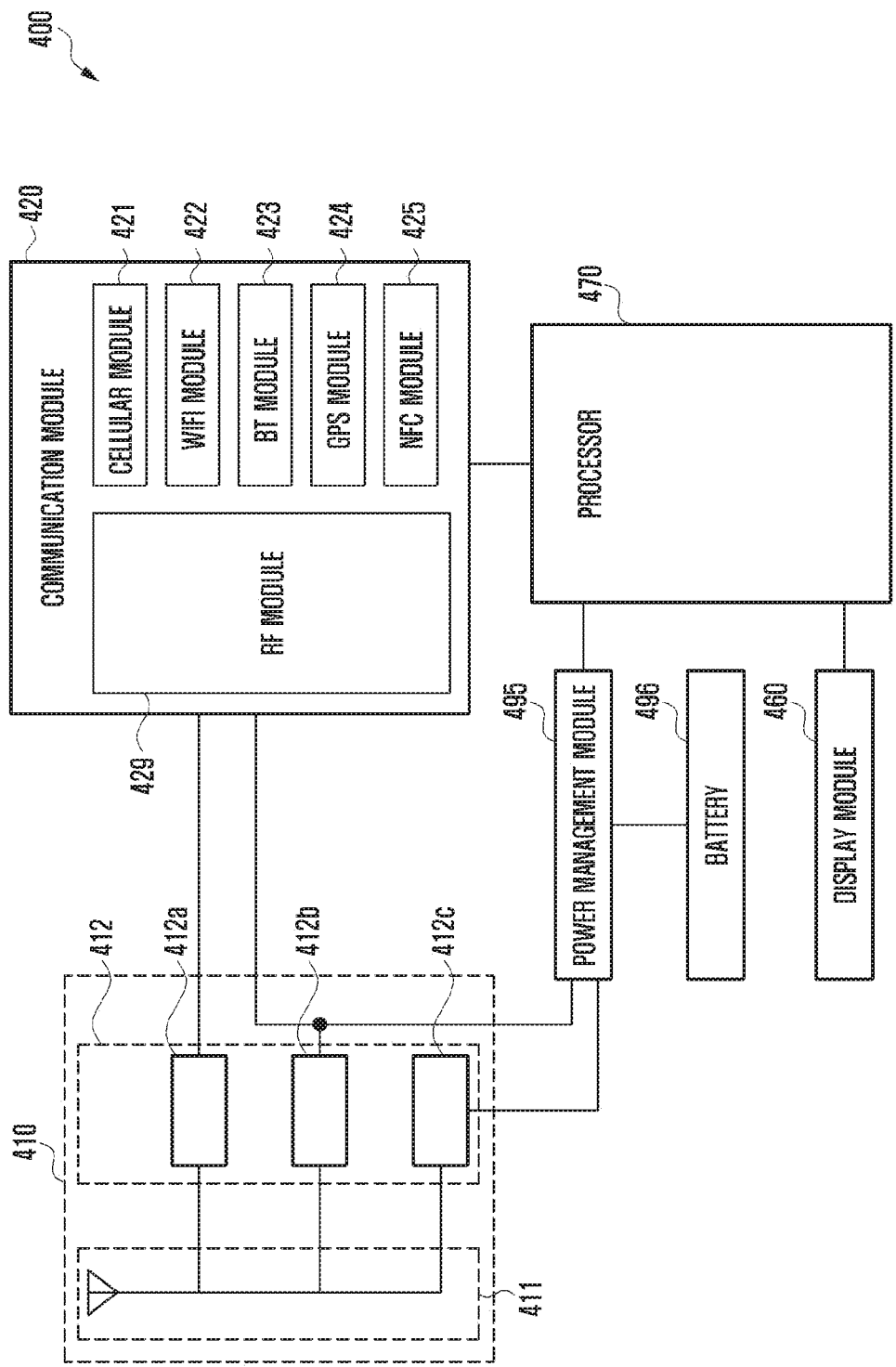
FIG. 4 is a schematic block diagram of an electronic device according to various embodiments of the present disclosure.

FIG. 4 is a schematic block diagram of an electronic device according to various embodiments of the present disclosure. Referring to FIG. 4, the electronic device 400 may include an antenna 410, a power management module 495, a battery 496, a communication module 420, and a processor 470. The electronic device 400 may be the same electronic device as the electronic device 101 of FIG. 1 and the electronic device 201 of FIG. 2. Thus, the description of the same element will be omitted since previously described in FIG. 2.

The antenna 410 may be an antenna for at least one communication scheme among cellular, wireless fidelity (Wi-Fi), Bluetooth (BT), GPS, near field communication (NFC), and magnetic secure transmission (MST). In addition, the antenna 410 may be an antenna for wirelessly charging the battery 496.

For example, the antenna 410 may be a planar inverted F antenna (PIFA) or a monopole antenna, and the volume and the number of the antenna 410 may be determined depending on a service frequency, a bandwidth, a type, and the like. For example, the antenna 410 typically uses a low band of 700 MHz to 900 MHz, a mid band of 1700 MHz to 2100 MHz, and a high band of 2300 MHz to 2700 MHz, and may further use various wireless communication services such as BT, GPS, and WIFI.

According to various embodiments, the antenna 410 may be designed to be divided into several antennas by binding service bands having similar frequency bands. For example, in case of a European antenna that is responsible for voice communication and data communication of the electronic device, twenty five frequency bands for 2G (GSM850, EGSM, DCS, PCS), WCDMA (B1, B2, B5, B8), and LTE (B1, B2, B3, B4, B5, B7, B8, B12, B17, B18, B19, B20, B26, B38, B39, B40, B41) may have to be implemented. In this case, the electronic device may group twenty five bands by similar frequency bands. For example, the first antenna may be used to implement 2G (GSM850, EGSM, DCS, PCS), WCDMA (B1, B2, B5, B8), and LTE (B1, B2, B3, B4, B5, B8, B12, B17, B18, B19, B20, B26, B39), and the second antenna may be used to implement LTE (B7, B38, B40, B41).

The antenna 410 may include at least one of a radiation module 411 and a connection module 412. The radiation module 411 may convert an electric current supplied from, for example, the communication module 420 into an electromagnetic wave and radiate it to the outside. In addition, the radiation module 411 may convert an electromagnetic wave received from the outside into an electric current and transmit it to the power management module 495 or the communication module 420. That is, the radiation module 411 may serve as a passive element for transmitting and receiving radio waves.

The connection module 412 may include at least two connection modules, for example, a first connection module 412*a*, a second connection module 412*b*, and a third connection module 412*c*. A part of the connection module 412 may be included in one of two electrically connected electronic devices, and the other may be included in the other electronic device.

The connection module 412 may be electrically connected to the radiation module 411. When the antenna 410 is combined with (mounted to or fastened to) the electronic device 400, the connection module 412 may electrically connect the radiation module 411 and the communication module 420. The combination of the antenna 410 and the electronic device 400 may include a physical combination or a functional combination. At least a part of the connection module 412 may be located on a printed circuit board (PCB) of the electronic device 400. For example, the connection module 412 may include, on the PCB, a circuit for impedance matching, and wiring and terminals for connection with the radiation module 411.

The connection module 412 (e.g., the first connection module 412*a* and the second connection module 412*b*) may feed an electric current, received from the communication module 420, to the radiation module 411. In addition, the connection module 412 (e.g., the first connection module 412*a* and the second connection module 412*b*) may deliver an electric current, received from the radiation module 411, to the communication module 420. Also, the connection module 412 (e.g., the second connection module 412*b* and the third connection module 412*c*) may deliver an electric current, received from the radiation module 411, to the power management module 495.

In the connection module 412, the matching circuit may be electrically connected to the radiation module 411. For example, when the antenna 410 is combined with the electronic device 400, the matching circuit may be contact with the PCB and electrically connect the radiation module 411 and the PCB (e.g., the ground of the PCB). For example, the matching circuit may match the impedance between the radiation module 411 and the connection module 412. The matching circuit may include at least one circuit component. For example, the matching circuit may include, as a lumped element, at least one of a resistor, an inductor, and a capacitor. For example, the matching circuit may include, as a distributed element, at least one of a micro strip line and a strip line. Alternatively, the PCB may include the matching circuit. Additionally, the matching circuit may be located between the antenna 410 and the PCB.

The communication module 420, the power management module 495, the battery 496, the display module 460, and the processor 470 are the same as those of FIG. 2. Therefore, the description of FIG. 2 may be referred to.

Each of the above-described elements of the electronic device 400 may be formed of one or more components. The name of each element may vary depending on the type of electronic device. The electronic device 400 may be configured to include or exclude at least one of the above-described elements or to further include any other additional element. In addition, some of the elements of the electronic device 400 may be united into a single entity while performing the same functions as before.

The term "module" used in this disclosure may mean a unit including, for example, one or a combination of hardware, software, and firmware. The term "module" may be interchangeably used with other terms, for example, such as unit, logic, logical block, component, or circuit. The "module" may be the minimum unit, or a part thereof, of an integrally constructed component. The "module" may be the minimum unit, or a part thereof, for performing one or more functions. The "module" may be implemented mechanically or electronically. For example, according to the present disclosure, the "module" may include at least one of an application-specific integrated circuit (ASIC) chip, field-programmable gate arrays (FPGAs), and a programmable-logic device, which are known or to be developed later and perform particular functions.

FIGS. 5A to 5F are perspective views of an electronic device including an antenna according to various embodiments of the present disclosure. The structure of the electronic device will be described with reference to FIGS. 5A to 5F. The electronic device 500 illustrated in FIGS. 5A to 5F may include the configuration of the electronic device 101 or 400 described in FIGS. 1 to 4.

Figure 5A:
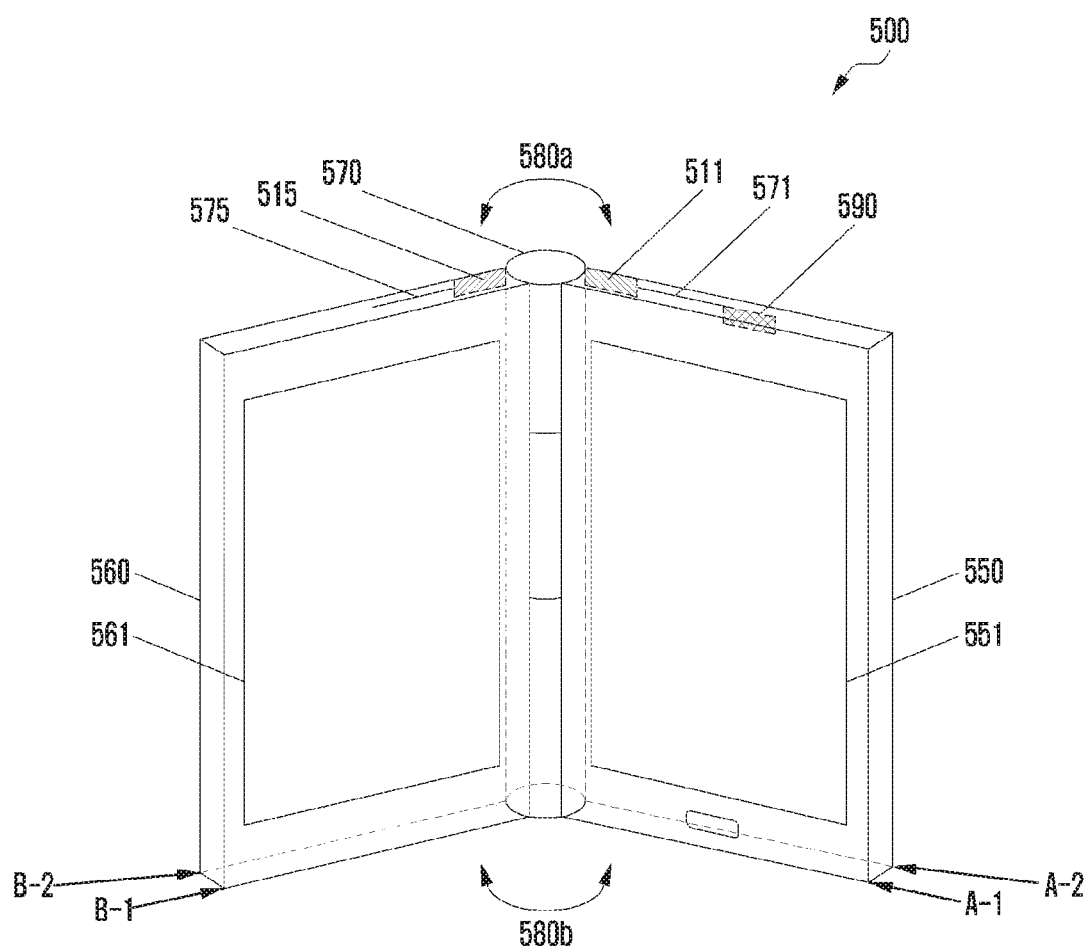
FIGS. 5A to 5F are perspective views of an electronic device including an antenna according to various embodiments of the present disclosure.

FIG. 5A is a diagram illustrating an embodiment in which the electronic device 500 is configured to include a dual display. In this embodiment, each of a first antenna pattern 571 and a second antenna pattern 575 is one.

Referring to FIG. 5A, the housing of the electronic device 500 may be configured to include a first housing part 550, a second housing part 560, and a connection part 570. The first housing part 550 and the second housing part 560 are used only for convenience of explanation. Thus, hereinafter, the description about the first housing part 550 may be equally applied to the second housing part 560, and the description about the second housing part 560 may be equally applied to the first housing part 550.

According to various embodiments, the first housing part 550 may be configured to include a first display 551, and the second housing part 560 may be configured to include a second display 561. Therefore, the electronic device 500 may be formed in a dual display structure. The first display 551 may be exposed to one surface A-1 of the first housing part 550, and the second display 561 may be exposed to one surface B-1 of the second housing part 560.

According to various embodiments, in the electronic device 500 of the dual display structure, the first housing part 550 and the second housing part 560 may be connected by the connection part 570. Also, the first housing part 550 and the second housing part 560 may be folded by the connection part 570.

In various embodiments, the first housing part 550 and/or the second housing part 560 may be a portion of the housing of the electronic device 500. The housing of the electronic device 500 may include therein a processor and various components of the electronic device.

In one embodiment, the first housing part 550 and/or the second housing part 560 may include at least one communication circuit, at least one antenna pattern, and/or at least one conductive member. For example, the first housing part 550 may include therein a first conductive member 511, a communication circuit 590, and a first antenna pattern 571. According to another example, the second housing part 560 may include therein a second conductive member 515, a communication circuit 590, and a second antenna pattern 575. Although the first antenna pattern 571 is shown as being one in the drawing, the first antenna pattern 571 may be formed as being plural. According to still another example, the shapes of the first antenna pattern 571 and the second antenna pattern 575 may vary. According to one embodiment, the first antenna pattern 571 may be electrically connected to the first conductive member 511.

According to various embodiments, the electronic device 500 may include at least one communication circuit 590, which may be electrically connected to at least one antenna pattern. For example, at least one communication circuit may be included inside at least one of the first housing part 550 and the second housing part 560. For example, the communication circuit 590 may be electrically connected to the first antenna pattern 571 or the second antenna pattern 575. As another example, the first housing part 550 or the second housing part 560 may all include the communication circuit 590. If one housing part (e.g., the first housing part 550 or the second housing part 560) includes the communication circuit 590, the other housing part may not have the communication circuit 590. For example, the communication circuit 590 may be included inside the first housing part 550 and not be included in the second housing part 560.

According to various embodiments, the first housing part 550 and the second housing part 560 may be folded in a first direction 580a. If there are conductive members on the first surface A-1 of the first housing part 550 and on the first surface B-1 of the second housing part 560, the conductive members may be connected to each other. FIG. 5A relates to an embodiment in which the first surfaces A-1 and B-1 have no conductive member, and another embodiment in which the first surfaces A-1 and B-1 have conductive members will be described later.

According to various embodiments, the first housing part 550 may be configured to include the first surface A-1 and the second surface A-2 which is opposite to the first surface A-1. The first surface A-1 and the second surface A-2 of the first housing part 550 may be different planes.

According to various embodiments, the second housing part 560 may be configured to include the first surface B-1 and the second surface B-2 which is opposite to the first surface B-1. The first surface B-1 and the second surface B-2 of the second housing part 560 may be different planes.

In one embodiment, the connection part 570 may have a shape like a hinge. If the connection part 570 has, for example, the shape of a hinge, the connection part 570 may be fixed to the first housing part 550 at one end thereof and fixed to the second housing part 560 at the other end while acting as a pivot on which the first housing part 550 and the second housing part 560 are folded. The first housing part 550 and the second housing part 560 may be folded in the first direction 580a or the second direction 580b by the hinge-shaped connection part 570.

According to one embodiment, the first housing part 550 and the second housing part 560 of the electronic device 500 may be folded in the second direction 580b. When the first housing part 550 and the second housing part 560 of the electronic device 500 is folded in the second direction 580b, at least a portion of the second surface A-2 of the first housing part 550 and at least a portion of the second surface B-2 of the second housing part 560 may be in contact with each other. When at least a portion of the second surface A-2 of the first housing part 550 is in contact with at least a portion of the second surface B-2 of the second housing part 560, at least one conductive member formed in such portions of the first and second housing parts 550 and 560 may produce an electric coupling path through which the length of an antenna can be adjusted.

In this embodiment in which at least a portion of the second surface A-2 of the first housing part 550 and at least a portion of the second surface B-2 of the second housing part 560 are in contact with each other, at least a portion of the second surface A-2 or B-2 may be a partial area of the second surface A-2 or B-2, or the entire area of the second surface A-2 or B-2. That is, when the first and second housing parts 550 and 560 are folded, the second surfaces A-2 and B-2 may be in contact with each other partially or entirely. According to various embodiments, the first and second housing parts 550 and 560 may include the conductive member, which may produce an electric coupling path between the first and second housing parts 550 and 560 and allows the adjustment of the antenna length. For example, the first housing part 550 may include the first conductive member 511, and the second housing part 560 may include the second conductive member 515. For example, the first conductive member 511 and/or the second conductive member 515 may be a magnet, an electromagnet, a magnetized metal, a pogo-pin, a C-clip, or a conductive connector. For example, the first conductive member 511 may be mounted inside the first housing part 550 and exposed partially or entirely to the second surface A-2 of the first housing part 550. Similarly, the second conductive member 515 may be mounted inside the second housing part 560 and exposed partially or entirely to the second surface A-2 of the second housing part 560.

According to various embodiments, the first conductive member 511 and the second conductive member 515 may be mounted in and exposed from the housing such that the first and second conductive members 511 and 515 meet or are adjacent to each other at the time of folding by the connection part 570.

According to various embodiments, the first housing part 550 and the second housing part 560 may be folded back and forth. For example, when the first and second housing parts 550 and 560 are folded in the second direction 580b, the first and second conductive members 511 and 515 may meet each other or be adjacent to each other. According to various embodiments, when the first and second conductive members 511 and 515 meet or are adjacent to each other, an electric coupling path may be formed to prevent a parasitic resonance by adjusting the length of the antenna and to set a resonance frequency.

For example, the parasitic resonance may be the occurrence of any unnecessary resonance (e.g., a virtual resonance). The electric coupling path caused by a combination of the first and second conductive members 511 and 515 may prevent the parasitic resonance and also prevent a frequency shift.

According to various embodiments, the first and second conductive members 511 and 515 may be combined with each other by a magnetic force thereof and thus form electrically the coupling path. Because the first conductive member 511 is electrically connected to the first antenna pattern 571 and because the second conductive member 515 is electrically connected to the second antenna pattern 575, the first and second antenna patterns 571 and 575 may be electrically connected to each other through an electric coupling between the first and second conductive members 511 and 515.

According to various embodiments, when the first and second antenna patterns 571 and 575 are electrically connected to each other, a physical or electrical length of the antenna may be adjusted. Through the adjustment of the antenna length, the resonance frequency may be set and the parasitic resonance may be prevented.

In one embodiment, when the length of the antenna is increased, a resonance frequency band may be adjusted lower.

Figure 5B:
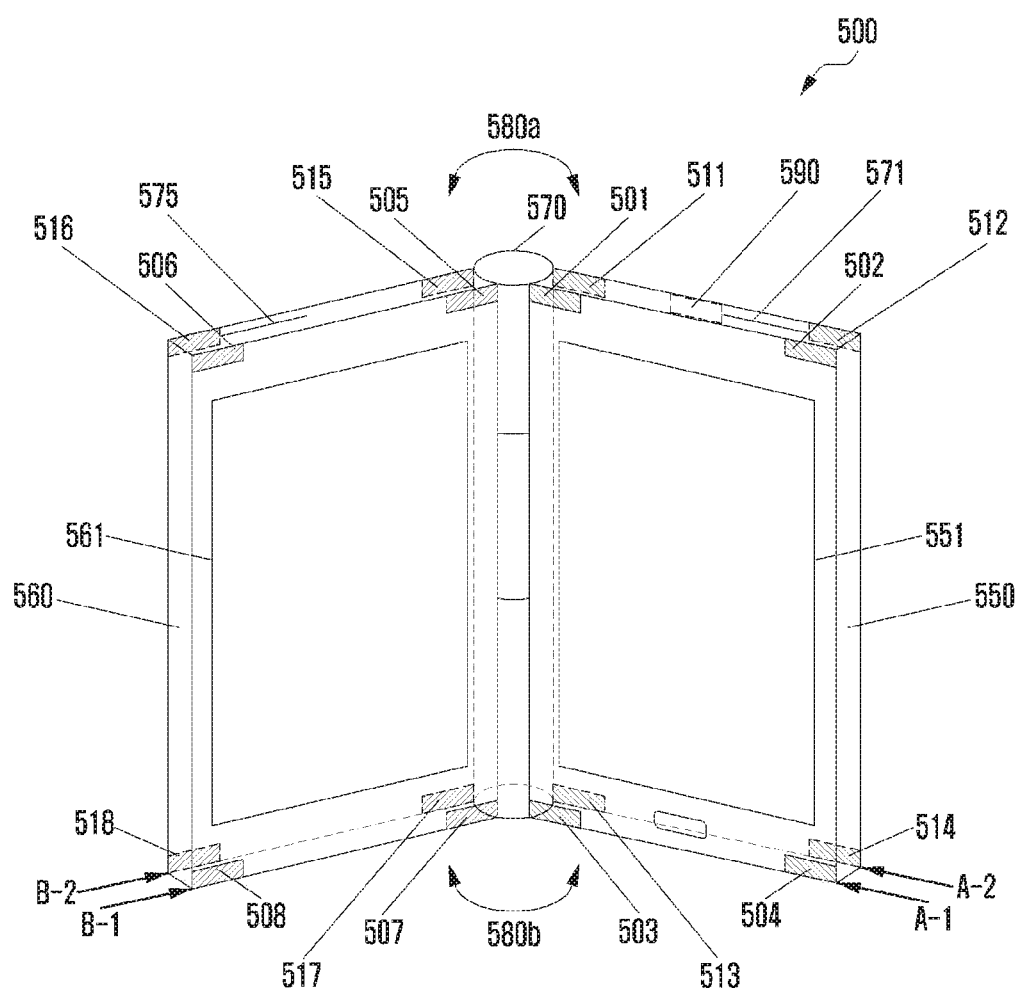

FIG. 5B is a diagram illustrating another embodiment in which the electronic device 500 is configured to include a dual display, and illustrating an embodiment in which a plurality of conductive members are included in the housing.

According to various embodiments, as similar to FIG. 5A, the electronic device 500 shown in FIG. 5B may include the first housing part 550, the second housing part 560, and the connection part 570. While FIG. 5A shows an embodiment in which each of the first and second housing parts 550 and 560 includes one conductive member, FIG. 5B shows an embodiment in which each of the first and second housing parts 550 and 560 includes a plurality of conductive members. Hereinafter, the description will be focused on the plurality of conductive members, and the same description as FIG. 5A will be not repeated.

According to various embodiments, at least one conductive member may be formed in at least a portion of the first housing part 550 and/or the second housing part 560.

In one embodiment, the first surface A-1 of the first housing part 550 may include first conductive members 501, 502, 503, and 504 at the four corners thereof, and the second surface A-2 of the first conductive member 550 may include first conductive members 511, 512, 513, and 514 at four corners thereof. While the first conductive members 501, 502, 503, and 504 of the first surface A-1 and/or the first conductive members 511, 512, 513, and 514 of the second surface A-2 are shown as four each in this embodiment, this is not construed as a limitation. In one embodiment, the first conductive members 501, 502, 503, and 504 of the first surface A-1 may be formed on at least a portion or the entirety of the first surface A-1. For example, the first housing part 550 may include such a conductive member at only some of the four corners of the first and/or second surface(s).

According to various embodiments, at least one conductive member of the first housing part 550 may be formed on at least a portion of the first and/or second surface(s) of the first housing part.

For example, in the first housing part 550, the first conductive members 501, 502, 503, and 504 of the first surface A-1 and/or the first conductive members 511, 512, 513, and 514 of the second surface A-2 are not limited to specific locations. For example, the first conductive members may be located at any portion of the first surface A-1 of the first housing part 550 so as to be in contact with the first surface B-1 of the second housing part 560. In another example, the first conductive members may be located at any portion of the second surface A-2 of the first housing part 550 so as to be in contact with the second surface B-2 of the second housing part 560.

In still another example, the first conductive members of the first housing part may be mounted inside the first housing part or exposed to at least a portion of the first housing part. For example, the first conductive members 501, 502, 503, and 504 may be mounted inside the first housing part 550 and exposed to the first surface A-1 of the first housing part 550. In another example, the first conductive members 511, 512, 513, and 514 may be contained in the first housing part 550 and exposed to the second surface A-2 of the first housing part 550.

According to various embodiments, although the shapes of the first conductive members 501, 502, 503, 504, 511, 512, 513, and 514 of the first housing part are depicted as a square, this is not construed as a limitation. The first conductive members may be formed in various forms such as text, image, symbol, mark, and number.

In various embodiments, the conductive members may be electrically connected to the antenna pattern. For example, at least one of the first conductive members 501, 502, 503, 504, 511, 512, 513, and 514 of the first housing part 550 may be electrically connected to the first antenna pattern 571.

In various embodiments, the antenna pattern may be electrically connected to a communication circuit. For example, the first housing part 550 may include the communication circuit therein, and the first antenna pattern 571 may be electrically connected to the communication circuit 590. The communication circuit 590 may be the same as or different from the communication circuit 590 described in FIG. 5A.

According to various embodiments, the conductive members, the antenna pattern, and the communication circuit may be electrically connected.

In various embodiments, a plurality of first conductive members may be electrically connected to a plurality of first antenna patterns, respectively. For example, some of the first conductive members 501, 502, 503, 504, 511, 512, 513, and 514 may be electrically connected to a plurality of the first antenna patterns 571, respectively. According to various embodiments, the number of the first antenna patterns is plural, and the shape of the first antenna pattern may be various.

In various embodiments, the second housing part 560 is a portion of the appearance of the electronic device and may include therein the processor and various elements of the electronic device.

In various embodiments, the second housing part 560 may include therein at least one second antenna pattern (not shown).

In various embodiments, some of a plurality of the second conductive members of the second housing part 560 may be electrically connected to the second antenna pattern. In various embodiments, at least one of the second conductive members 505, 506, 507, 508, 515, 516, 517, and 518 of the second housing part 560 may be electrically connected to the second antenna pattern 575. For example, the second conductive member 516 located on the second surface B-2 of the second housing part 560 may be electrically connected to the second antenna pattern 575. The second antenna pattern 575 is not limited in number and shape to the drawings, and a plurality of the second antenna patterns may be disposed in a variety of shapes in the vicinity of the second conductive members 505, 506, 507, 508, 515, 516, 517, and 518.

In various embodiments, a plurality of the second conductive members may be electrically connected to the second antenna patterns, respectively. For example, some of the second conductive members 505, 506, 507, 508, 515, 516, 517, and 518 may be electrically connected to the second antenna pattern 575. Although not shown, a plurality of the second antenna patterns may be configured to be coupled to a plurality of the second conductive patterns. In various embodiments, the second antenna patterns may be electrically connected to the communication circuit. For example, the second antenna pattern 575 may be electrically connected to the communication circuit 590.

In various embodiments, the first conductive members 501, 502, 503, 504, 511, 512, 513, and 514 and the second conductive members 505, 506, 507, 508, 515, 516, 517, and 518 may include a magnetic material or any other material attracted by a magnet. For example, the first conductive members 501, 502, 503, 504, 511, 512, 513, and 514 and the second conductive members 505, 506, 507, 508, 515, 516, 517, and 518 may be a magnet, an electromagnet, a magnetized metal, a pogo-pin, a C-clip, a conductive connector, and the like.

In one embodiment, the first housing part 550 and the second housing part 560 may be folded in the first direction 580*a*. For example, when the first and second housing parts 550 and 560 are folded in the first direction 580*a*, the first surface A-1 of the first housing part 550 and the first surface B-1 of the second housing part 560 may be in contact with each other. The first surface A-1 of the first housing part 550 and the first surface B-1 of the second housing part 560 may meet each other at least partially or entirely.

In one embodiment, when the first and second housing parts 550 and 560 include the conductive members at four corners and are folded in the first direction 580*a*, the first and second housing parts 550 and 560 may be combined with each other by all of the conductive members 501, 502, 503, and 504 of the first housing part 550 and all of the conductive members 505, 506, 507, and 508 of the second housing part 560.

In one embodiment, when the first and second housing parts 550 and 560 include the conductive members at some of four corners and are folded in the first direction 580*a*, the first and second housing parts 550 and 560 may be combined with each other by some of the conductive members 501, 502, 503, and 504 of the first housing part 550 and some of the conductive members 505, 506, 507, and 508 of the second housing part 560.

In various embodiments, the first housing part 550 and the second housing part 560 may be combined by the magnetism of the conductive member. In various embodiments, the shape, number, and location of the conductive members are not limited to specific ones.

In another embodiment, the first housing part 550 and the second housing part 560 may be folded in the second direction 580*b*. For example, when the first and second housing parts 550 and 560 are folded in the second direction 580*b*, the second surface A-2 of the first housing part 550 and the second surface B-2 of the second housing part 560 may be in contact with each other. When the first and second housing parts 550 and 560 meet each other, four corners of the first housing part may coincide with four corners of the second housing part by the conductive members in each housing part. For example, when the second surface A-2 of the first housing part 550 and the second surface B-2 of the second housing part 560 meet each other, four corners of the first housing part 550 may coincide with four corners of the second housing part 560 by the conductive members 511, 512, 513, 514, 515, 516, 517, and 518.

In one embodiment, when the first and second housing parts 550 and 560 have the conductive members at four corners and are folded in the second direction 580b, the first and second housing parts 550 and 560 may be combined with each other by at least one of the conductive members 511, 512, 513, 514, 515, 516, 517, and 518.

In one embodiment, when the first and second housing parts 550 and 560 have the conductive members at some of four corners and are folded in the second direction 580b, the first and second housing parts 550 and 560 may be combined with each other by some of the at least one of the conductive members 511, 512, 513, 514, 515, 516, 517, and 518.

In various embodiments, when the first and second housing parts 550 and 560 are folded in the second direction 580b, the first and second housing parts 550 and 560 may be combined by the magnetism of the conductive member, for example, the magnetism of the first conductive members 511 to 514 of the first housing part 550 and the magnetism of the second conductive members 515 to 518 of the second housing part 560. The conductive members 511 to 514 of the first housing part 550 and the second conductive members 515 to 518 of the second housing part 560 are not limited to the number, shape and location shown in the drawings. The first conductive members 501 to 504 of the first housing part 550 and the second conductive members 505 to 508 of the second housing part 560 may be located at suitable places for combination through contact or adjacency.

In another embodiment, when the first and second housing parts 550 and 560 are in contact with each other, the conductive member of the first housing part 550 and the conductive member of the second housing part 560 may be electrically connected to each other. For example, when the second surface A-2 of the first housing part 550 and the second surface B-2 of the second housing part 560 are in contact with each other, the first conductive members 511, 512, 513, and 514 may be electrically connected to the second conductive members 515, 516, 517, and 518. Each of the first conductive members 511, 512, 513, and 514 may be electrically connected to a corresponding one of the second conductive members 515, 516, 517, and 518 disposed at a corresponding position. For example, the first conductive member 511 may be coupled to the second conductive member 515, the first conductive member 512 may be coupled to the second conductive member 516, the first conductive member 513 may be coupled to the second conductive member 51y, and the first conductive member 514 may be coupled to the second conductive member 518.

In another embodiment, when the first and second conductive members are electrically connected to each other, the antenna patterns electrically connected to the conductive members may be electrically connected to or coupling with each other. For example, when the first conductive members 511, 512, 513, and 514 are electrically connected to the second conductive members 515, 516, 517, and 518, the first antenna pattern 571 may be electrically connected to or coupling with the second antenna pattern 575.

In various embodiments, the electrical or physical length of the antenna may be adjusted as the first and second antenna patterns are electrically connected to each other. For example, when the electrical or physical length of the antenna is adjusted, the resonance frequency may be shifted, i.e., adjusted, and any unnecessary resonance may be prevented. In various embodiments, electrical coupling between the first and second antenna patterns through at least one conductive member may prevent any unnecessary resonance and set a desired frequency.

In various embodiments, if there is a material of interfering with radio waves when the first antenna pattern 571 included in the first housing part 550 radiates or receives radio waves, the resonance frequency may be shifted and the parasitic resonance may occur. For example, the radio wave interference material may be a conductive material, such as a metal, which may deteriorate performance when the antenna pattern radiates electromagnetic waves. For example, the radio wave interference material may be a display or a metallic material. According to various embodiments, the antenna length may be adjusted to prevent a frequency shift and a parasitic resonance. For example, the antenna length may be adjusted by electrically coupling the first and second antenna patterns. For example, when the first and second conductive members 512 and 516 are electrically connected to each other, the first and second antenna patterns may be electrically connected to each other, thereby adjusting the length of the antenna. If the first and second antenna patterns are electrically connected according to various embodiments, the parasitic resonance may be prevented and the resonance frequency band may be set.

According to various embodiments, the first antenna pattern may be formed on the PCB equipped in the first housing part 550. For example, the first antenna pattern in the first housing part 550 may be connected to (i.e., electrically connected to or coupling with) the second antenna pattern in the second housing part 560 through the conductive member. According to various embodiments, the second antenna pattern may be used for increasing the length (i.e., electrical or physical length) of the antenna.

According to various embodiments, the antenna length may be adjusted as the second antenna pattern forms at least partially the ground or is electrically connected to the ground. That is, the length of the antenna may be increased by the second antenna pattern.

In one embodiment, when the length of the antenna is increased, the resonance frequency band may be lowered. For example, by increasing the length of the antenna (410 in FIG. 4), the resonance frequency may be set such that the resonance frequency is not shifted even if the first housing part 550 is adjacent to the radio wave interference material. The radio wave interference material may be the second housing part 560 including the second display 561. That is, the resonance frequency band desired by the user may be selected through the adjustment of the antenna length.

Figure 5C:
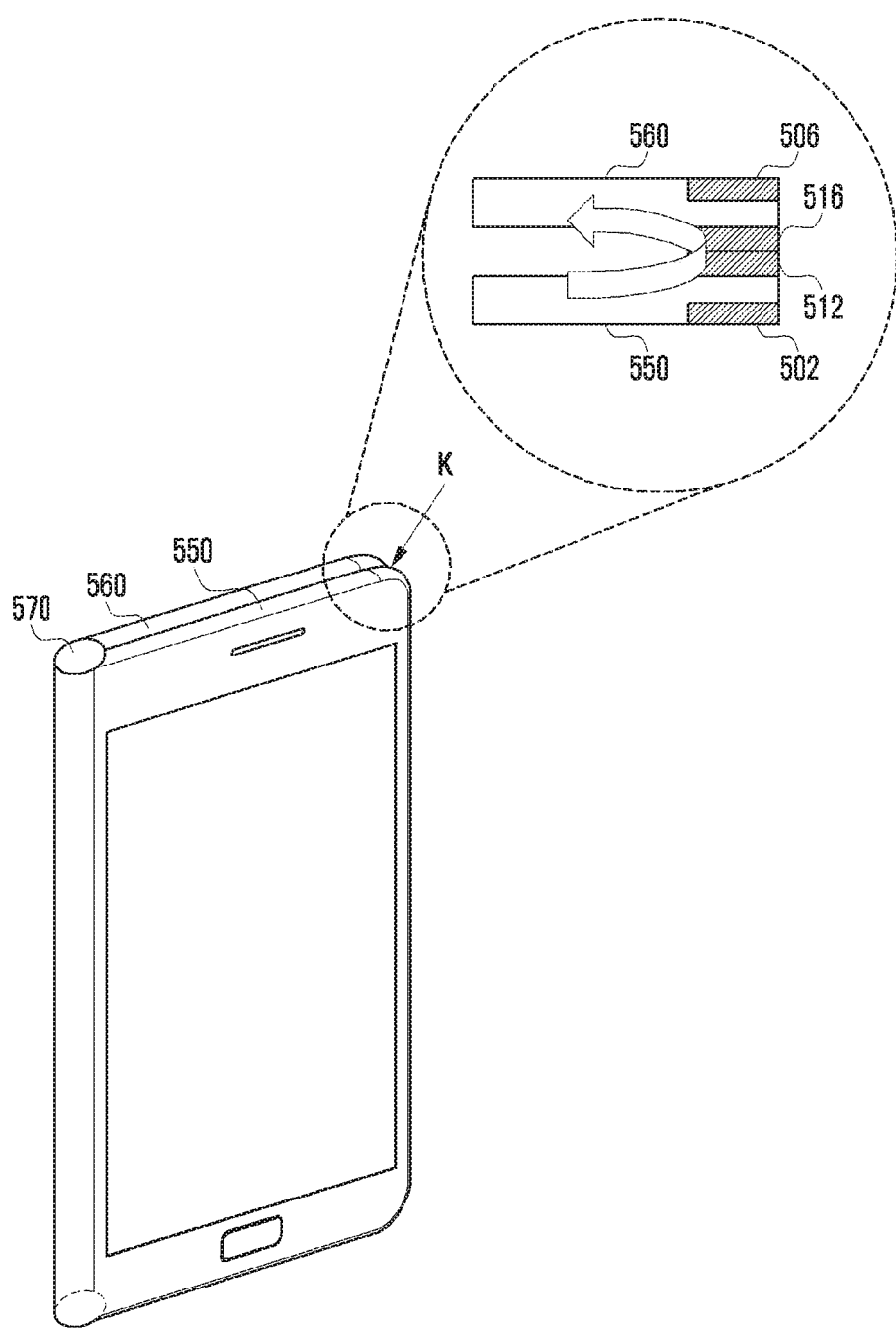

FIG. 5C illustrates one embodiment in which the first and second housing parts 550 and 560 of the electronic device 500 are folded in the second direction 580b. In FIG. 5C, the electronic device 500 may include at least one conductive member.

Referring to FIG. 5C, as the first and second housing parts 550 and 560 are folded in the second direction 580b, the second surface of the first housing part 550 and the second surface of the second housing part 560 are in contact with each other as indicated by reference K. When the second surface of the first housing part 550 and the second surface of the second housing part 560 meet each other, the first conductive member 512 of the first housing part 550 and the second conductive member 516 of the second housing part 560 may be electrically connected to or coupling with each other.

In another embodiment, when the first and second housing parts 550 and 560 are folded in the second direction 580b and not in contact with (i.e., adjacent to) each other, electrical coupling may occur between the conductive members. If the electrical coupling occurs between the conductive members (i.e., the first and second conductive members), the first and second antenna patterns may be electrically connected to each other. For example, as the first and second antenna patterns are electrically connected, an electric current may flow in the direction of an arrow shown in the drawing. In another example, when an electric current is supplied to the first antenna pattern, the current may flow to the second antenna pattern through the first and second conductive members 512 and 516. As the first and second conductive members 512 and 516 are connected (i.e., electrically connected or coupling), a variation in performance of the antenna may be prevented.

In this embodiment shown in FIG. 5C, the electronic device 500 includes the first conductive members 502 and 512 of the first housing part 550 and the second conductive members 506 and 516 of the second housing part 560. In addition, the first and second housing parts 550 and 560 are combined by the first and second conductive members 512 and 516. However, the number, shape, and location of the conductive members are not limited to specific ones. That is, the first and second housing parts 550 and 560 may include one or more conductive members at suitable locations where the first and second housing parts 550 and 560 meet each other for combination.

Figure 5D:
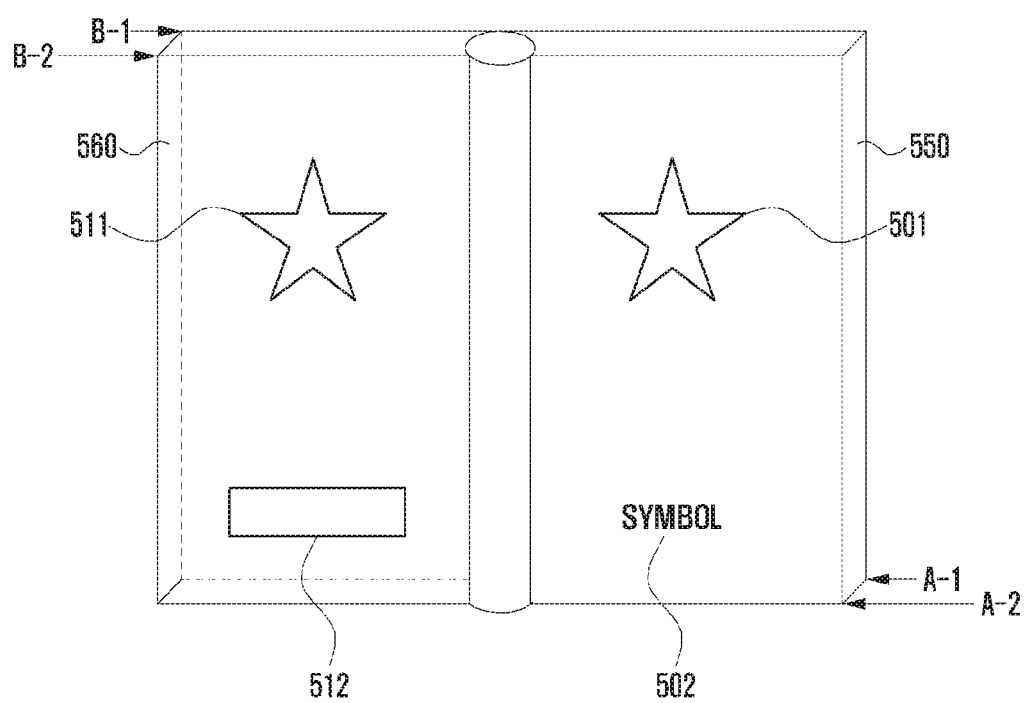

FIG. 5D is a diagram illustrating an example of the conductive member of the first and second housing parts 550 and 560 of the electronic device.

According to various embodiments, the first housing part 550 may include one or more first conductive members 501 and 502 on the first surface A-1 and the second surface A-2. According to various embodiments, the second housing part 560 may include one or more second conductive members 511 and 512 on the first surface B-1 and the second surface B-2. For example, the first conductive member and/or the second conductive member may be an image 501, text 502, or any other logo shape such as a mark or a symbol. For example, the conductive member 502 may be text that represents a company name of the electronic device, a name of a communication company, or a unique name of the electronic device. The first conductive member in the form of a logo may include a magnetic material or any other material attracted by a magnet. For example, the first conductive member in the form of a logo may be a magnet, an electromagnet, a magnetized metal, a pogo-pin, a C-clip, or a conductive connector.

The connection between the first and second conductive members is the same as described in FIG. 5A.

Figure 5E:
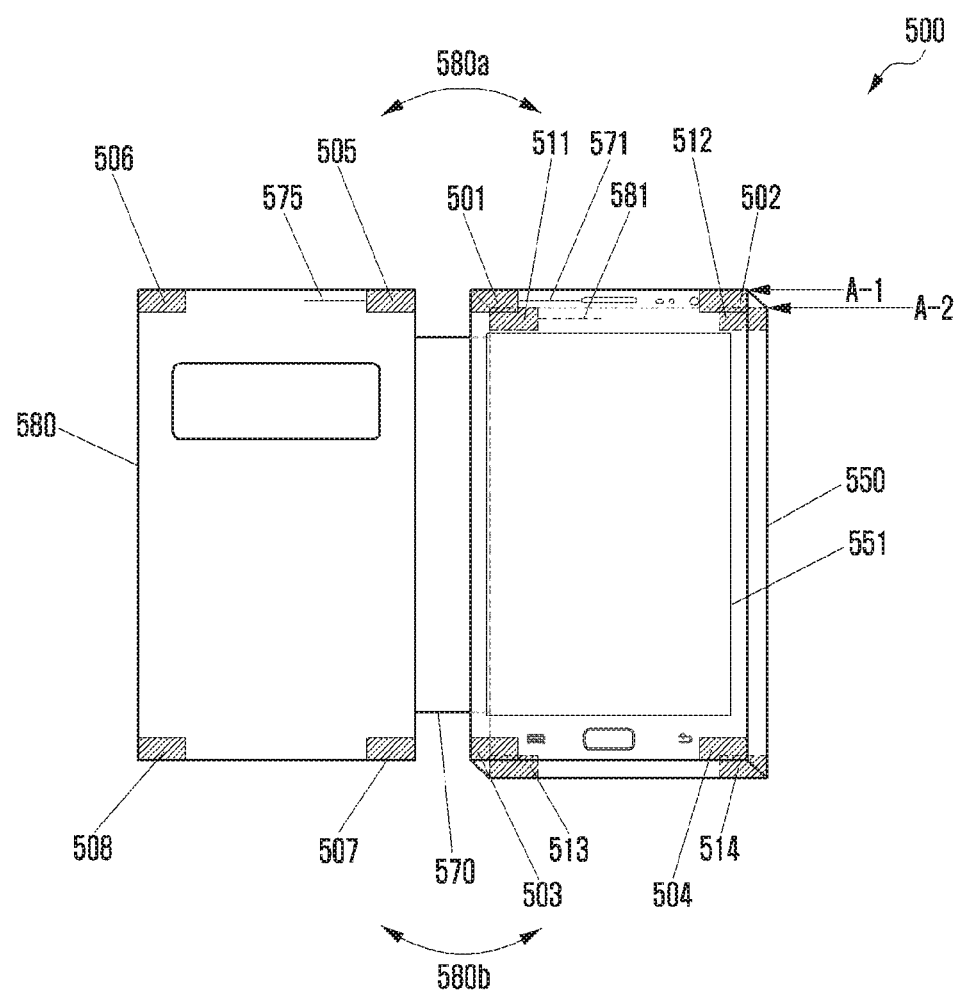

FIG. 5E shows an example in which the housing of the electronic device 500 includes a case having a flip cover shape. The appearance of the electronic device 500 may include the first housing part 550. One side of the first housing part 550 may be connected to one side of the connection part 570.

According to various embodiments, the connection part 570 may be connected at the other side to a cover 580 for covering the first housing part 550.

For example, the cover 580 may be formed in a plate shape as shown in FIG. 5E. For example, the plate shape may be flat and even. The cover 580 may include the second conductive members 505, 506, 507, and 508. The second conductive members 505, 506, 507, and 508 may be exposed to a portion of the cover 580 or may be mounted inside the cover 580. For example, the cover 580 may be a flip cover.

According to various embodiments, the number, shape, and location of the second conductive members 505, 506, 507, and 508 are not limited to specific ones. In particular, the number of the second conductive members is not limited, and there may be one or more second conductive members at one or more positions which may be in contact with or adjacent to the first conductive member(s) of the first housing part 550.

According to various embodiments, when the cover 580 is folded in the first direction 580*a*, the second conductive members 505, 506, 507, and 508 may be in contact with the first surface A-1 of the first housing part 550.

According to one embodiment, as the cover 580 and the first housing part 550 are folded, the second conductive member of the cover 580 may be electrically connected to the first conductive member of the first housing part 550. For example, when the second conductive members 505, 506, 507, and 508 meet the first surface A-1 of the first housing part 550, the second conductive members 505, 506, 507, and 508 may be electrically connected to the first conductive members 501 to 504 on the first surface A-1 of the first housing part 550, respectively.

According to another embodiment, when the cover 580 is folded in the second direction 580*b*, the second conductive members 505, 506, 507, and 508 may be in contact with the second surface A-2 of the first housing part 550.

According to one embodiment, when the second conductive members 505, 506, 507, and 508 are in contact with the second surface A-2 of the first housing part 550, the second conductive members 505, 506, 507, and 508 may be connected to the first conductive members 511 to 514 on the second surface A-2 of the first housing part 550. According to one embodiment, when the second conductive members 505, 506, 507, and 508 are in contact with the second surface A-2 of the first housing part 550, at least one of the second conductive members 505, 506, 507, and 508 may be connected to at least corresponding one of the first conductive members 511 to 514 on the second surface.

According to various embodiments, the first conductive member and the second conductive member may be a magnet, an electromagnet, a magnetized metal, a pogo-pin, a C-clip, or a conductive connector.

According to various embodiments, the first conductive members 501 to 504 and the second conductive members 505 to 508 may be combined with each other by magnetism and thus electrically connected to each other. When the first conductive members 501 to 504 and the second conductive members 505 to 508 are electrically connected, the parasitic resonance may be prevented and the antenna resonance frequency band may be adjusted.

According to various embodiments, when the first conductive members 501 to 504 and the second conductive members 505 to 508 are magnetically combined, the first antenna pattern and the second antenna pattern may be electrically connected to each other through a combination of the first conductive members 501 to 504 and the second conductive members 505 to 508.

In various embodiments, there may be a plurality of the first antenna patterns 571 and 581 and the second antenna pattern 575, which may be connected to all or some of the first conductive members 501 to 504 and 511 to 514 and the second conductive members 505 to 508.

According to various embodiments, the cover 580 may include an open area through which a portion of the first display 551 is exposed when the first display 551 is covered. On such a portion, the first display 551 may display a clock, a weather, a battery state, an execution screen of a specific application (e.g., message, call, scheduler, alarm, etc.), a widget screen, a network connection status, and the like.

When the cover 580 covers the first display 551, the above portion of the first display 551 corresponds, in position, to the open area of the cover 580.

According to various embodiments, the connection part 570 is a portion of the case for covering the first housing part 550. The connection part 570 may be detached from the first housing part 550 at one side and also detached from the cover 580 at the other side. The connection part 570 may include at one side a first cover member (not shown) for detachment from the first housing part 550 and also include at the other side a second cover member (not shown) for detachment from the cover 580.

According to various embodiments, the connection part 570 may include an envelope member. The envelope member may be made of a soft material, for example, at least one of flexible and tough materials such as artificial leather, natural leather, silicone, urethane, or a combination thereof. The envelope member may surround the first and second cover members at different portions.

According to various embodiments, the first and second cover members may be of the same soft material as the envelope member, and may be directly attached to the first housing part 550 and the cover 580.

Figure 5F:
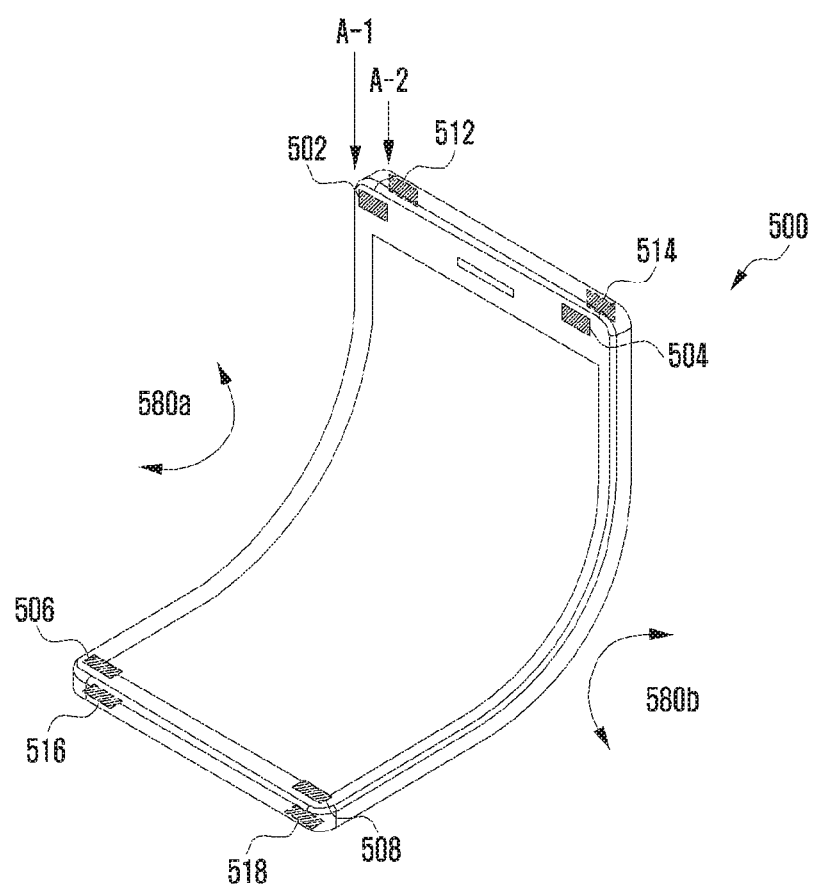
Figure 5F:
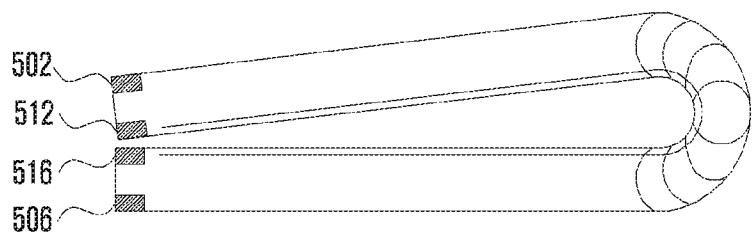

FIG. 5F shows an example in which the electronic device is a flexible electronic device.

Referring to FIG. 5F, the electronic device 500 may be a flexible electronic device having a bent or curved property as indicated by a reference numeral 591. In various embodiments, all of internal elements of the flexible electronic device may have flexibility. For example, the flexible electronic device may include a flexible display having a bent or curved property. According to various embodiments, when the electronic device 500 is configured as the flexible electronic device, the connection part 570 may be omitted from the housing of the electronic device 500.

According to various embodiments, when the electronic device 500 is the flexible electronic device, the electronic device 500 may be bent or curved. In various embodiments, when the electronic device 500 may be bent or curved, the parasitic resonance and frequency shift may occur. In various embodiments, the electrical connection of the conductive members increases the antenna length, thereby preventing the parasitic resonance and frequency shift. According to various embodiments, the number of conductive members may be varied.

According to one embodiment, the electronic device 500 may have four conductive members on one surface. For example, the electronic device 500 may include the first conductive members 502 and 504 on a portion of the first surface A-1 having the flexible display and also include the second conductive members 506 and 508 on another portion of the first surface A-1. In addition, the electronic device 500 may include the first conductive members 512 and 514 on a portion of the second surface A-2 opposite to the first surface and also include the second conductive members 516 and 518 on another portion of the second surface A-2. According to various embodiments, the electronic device 500 may be folded by being bent or curved. A reference numeral 592 indicates a side view of the folded structure. When the electronic device is folded toward the second surface A-2, the first and second conductive members 512 and 516 which are on the same surface of the electronic device 500 may be electrically connected to each other by being in contact with or adjacent to each other. Also, the first conductive member 512 may be electrically connected to (even may not be in contact with) the first antenna pattern, and the second conductive member 516 may be connected to the second antenna pattern. The connection of the first and second antenna patterns may mean that the length (physical length or electrical length) of the antenna may be adjusted.

According to various embodiments, the shape, number, and location of the conductive member are not limited to specific ones.

According to various embodiments, by designing the length of the antenna to be long, the resonance frequency increasable by the conductive material may be lowered. The length of the antenna may be adjusted as the first antenna pattern forms at least partially the ground or is electrically connected to the ground.

Figure 6:
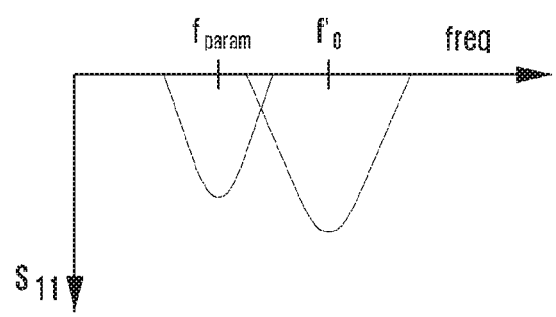
FIG. 6 is a graph illustrating the resonance frequency of an antenna according to various embodiments of the present disclosure.
Figure 6:
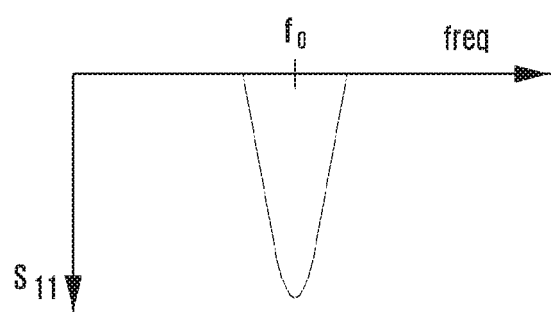

FIG. 6 is a graph illustrating the resonance frequency of an antenna according to various embodiments of the present disclosure.

According to various embodiments, the electronic device 500 described above in FIGS. 5A to 5F may be the same as the electronic device described below. That is, the electronic device described below may have, but not limited to, a structure of any one of the above-described electronic devices.

FIG. 6 is a graph illustrating the resonance frequency of an antenna according to various embodiments of the present disclosure.

The frequency may be changed high. For example, as shown in a graph 660, a resonance frequency ($f_0$) (this is shown in a graph 670 and different from ($f'_0$) may be shifted to another resonance frequency ($f'_0$). In addition, a parasitic resonance may occur at an unnecessary frequency ($f_{param}$). The parasitic resonance may be the occurrence of any unnecessary resonance.

According to various embodiments, it is necessary to adjust the length of the antenna so that the resonance frequency is set to $f_0$. For example, it is possible to realize a long antenna length so that the resonance frequency ($f_0$) lower than the resonance frequency ($f'_0$) is set. The second antenna pattern may be disposed inside the second housing part 560 to increase the length of the antenna. The second antenna pattern may form at least partially the ground or be electrically connected to the ground, so that the antenna may be long.

According to various embodiments, when the first antenna pattern of the first housing part 550 and the second antenna ground pattern of the second housing part 560 are connected by conductive connectors, the length of the antenna may become longer. If the length of the antenna becomes longer, it is possible to set the resonance frequency ($f_0$) lower than the shifted resonance frequency ($f'_0$).

According to various embodiments, as the first antenna pattern of the first housing part 550 and the second antenna pattern of the second housing part 560 are electrically connected by the conductive connectors, the parasitic resonance occurring at a frequency ($f_{param}$) may be eliminated by the electrical connection between the first and second housing parts 550 and 560.

Referring to the graph 670 according to various embodiments, when the length of the antenna is increased by the electrical connection between the first and second antenna patterns, the resonance frequency may be lowered. By increasing the length of the antenna in which the first antenna pattern of the first housing part 550 and the second antenna pattern of the second housing part 560 are connected, it is possible to set the resonance frequency (e.g., $f_0$) capable of transmitting and receiving electromagnetic waves. Also, the parasitic resonance occurring at the unnecessary frequency ($f_{param}$) may be eliminated by the electrical connection between the first and second housing parts 550 and 560.

Figure 7A:
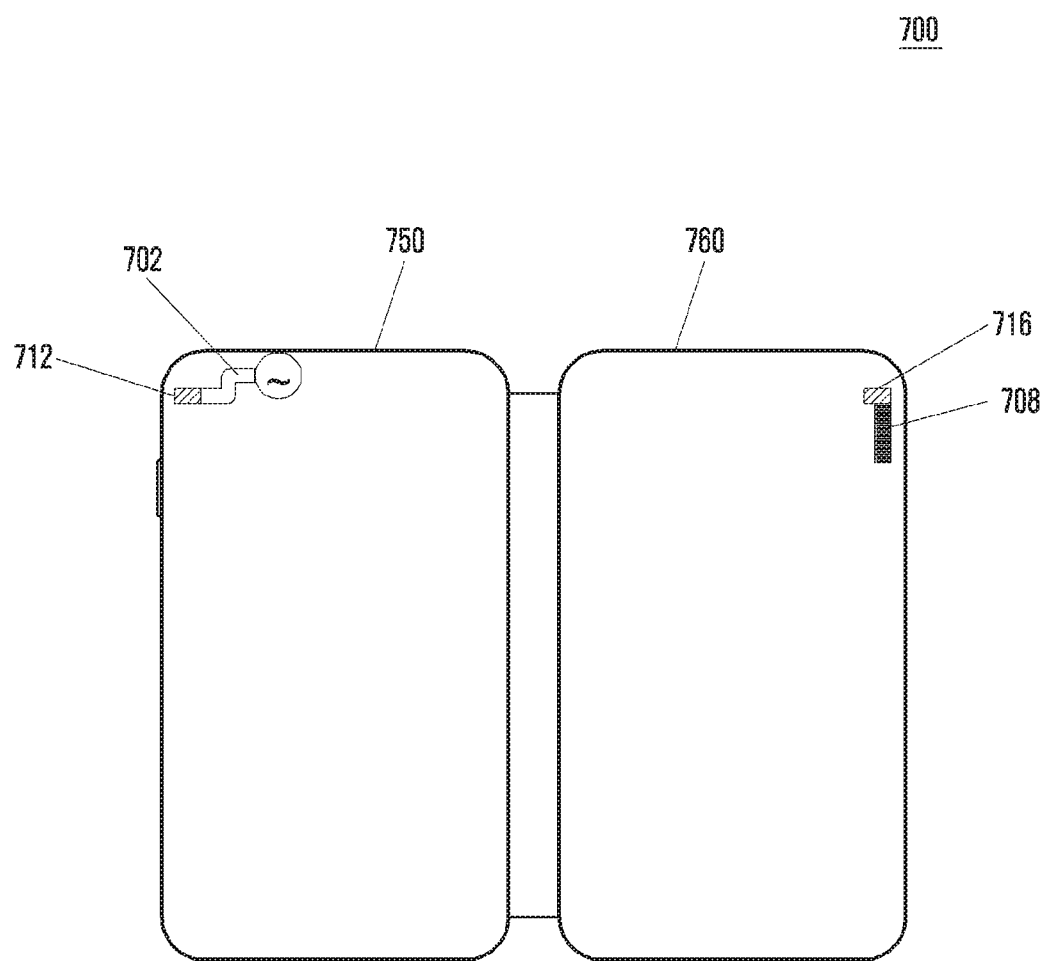
FIGS. 7A to 7C are schematic diagrams of an electronic device including an antenna according to various embodiments of the present disclosure.
Figure 7B:
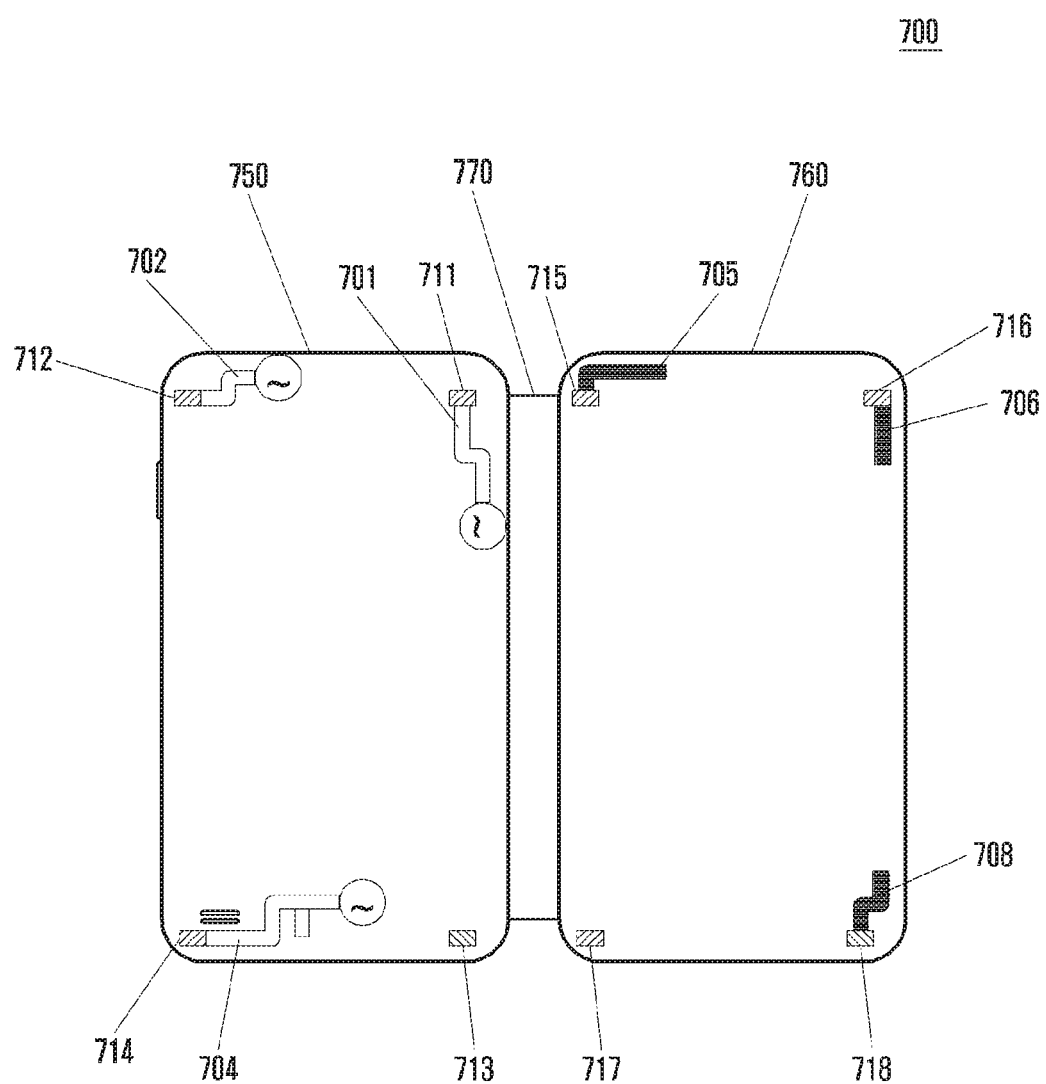
Figure 7C:
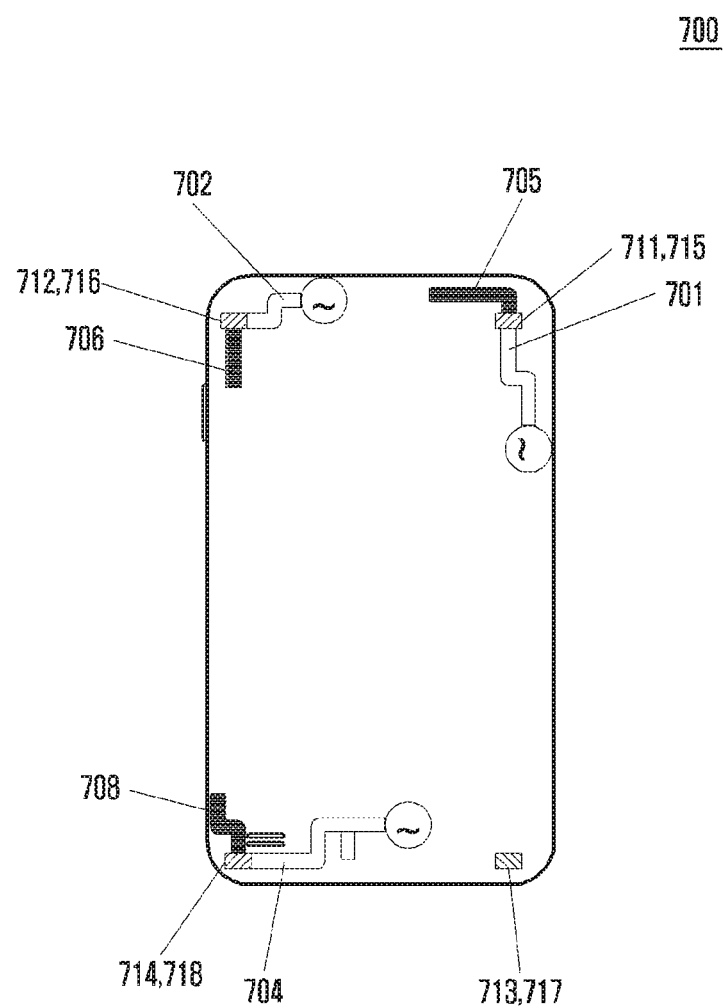

FIGS. 7A to 7C are schematic diagrams of an electronic device including an antenna according to various embodiments of the present disclosure.

FIG. 7A is a diagram illustrating the rear surface of the electronic device 700 being in a state where the first and second housing parts 750 and 760 of the electronic device 700 are not bent nor folded.

According to one embodiment, the electronic device 700 may include one conductive member in each of the first and second housing parts 750 and 760. According to various embodiments, the first conductive member and the second conductive member may be disposed at suitable positions for being in contact with or adjacent to each other.

For example, the electronic device 700 may include the first conductive member 712 in the first housing part 750 and the second conductive member 716 in the second housing part 760. The first conductive member 712 may be electrically connected to the first antenna pattern 702, and the second conductive member 716 may be electrically connected to the second antenna pattern 708.

According to various embodiments, when the first and second conductive members 712 and 716 are adjacent to or in contact with each other, an electric coupling path may be formed. According to various embodiments, when the first and second conductive members 712 and 716 are adjacent to or in contact with each other, the length of the antenna may be increased by the formation of the electric coupling path. According to various embodiments, the resonance frequency shift and the parasitic resonance may be prevented by the electric coupling path and/or the antenna length.

FIG. 7B is a diagram illustrating the rear surface of the electronic device 700 being in a state where the first and second housing parts 750 and 760 are not bent nor folded.

Referring to FIG. 7B, the electronic device 700 may include a plurality of conductive members in each housing part. The rear surface direction of the electronic device 700 may be the same as the second surface A-2 or B-2 in FIG. 5A. The electronic device 700 may include the first housing part 750, the second housing part 760, and the connection part 770 disposed between the first and second housing parts 750 and 760.

According to various embodiments, the first housing part 750 of the electronic device 700 may include therein the first conductive members 711, 712, 713, and 714 and the first antenna patterns 701, 702, and 704. The first conductive member may include a magnetic material or any other material attracted by a magnet. For example, the first conductive member may be a magnet, an electromagnet, a magnetized metal, a pogo-pin, a C-clip, or a conductive connector. Although shown are the first conductive patterns 711, 712, 713, and 714 and the first antenna patterns 701, 702 and 704 formed on the second surface of the electronic device 700, the first surface (not shown, but A-1, B-1 in FIG. 5A) may also include at least one first conductive member and at least one first antenna pattern.

In various embodiments, not all of the first conductive members 711, 712, 713, and 714 disposed inside the first housing part 750 are electrically connected to the first antenna pattern. If necessary, some first conductive members 711, 712, and 713 may be electrically connected to the first antenna patterns 701, 702, and 704. These first conductive members 711, 712, and 713 may be connected to the first antenna patterns 701, 702, and 704, respectively.

In various embodiments, although it is described above for example that three antenna patterns 701, 702, and 703 are electrically connected to the first conductive member, this is not construed as a limitation. For example, the first antenna patterns 701, 702, and 703 may be included in the first housing part 750 and connected to the communication module. The first antenna patterns 701, 702, and 704 may be antennas for at least one communication of cellular, wireless fidelity (Wi-Fi), Bluetooth (BT), GPS, near field communication (NFC), and magnetic secure transmission (MST).

For example, the first antenna patterns 701, 702, and 704 may be a planar inverted F antenna (PIFA) or a monopole antenna, and the volume and number of the antennas may be determined depending on a service frequency, a bandwidth, a type, and the like. For example, the antenna typically uses a low band of 700 MHz to 900 MHz, a mid band of 1700 MHz to 2100 MHz, and a high band of 2300 MHz to 2700 MHz, and may further use various wireless communication services such as BT, GPS, and WIFI.

In various embodiments, the second housing part 760 of the electronic device 700 may include therein the second conductive members 715, 716, 717, and 718 and the second antenna patterns 705, 706, and 708. The second conductive member may include a magnetic material or any other material attracted by a magnet. For example, the second conductive member may be a magnet, an electromagnet, a magnetized metal, a pogo-pin, a C-clip, or a conductive connector. The second antenna patterns 705, 706, and 708 may be necessary for preventing the frequency of the antenna from being shifted. The antenna length may be adjusted as the second antenna patterns 705, 706, and 708 form at least partially the ground or are electrically connected to the ground. The adjustment of the antenna length may allow the setup of the resonance frequency and prevent any unnecessary resonance.

According to various embodiments, the second antenna patterns 705, 706, and 708 may be connected to the antenna patterns 701, 702, and 704 of the first housing part 750 through the second conductive members 715, 716, and 718. The first antenna patterns 701, 702, and 704 and the second antenna patterns 705, 706, and 708 may be portions of the antenna. The antenna patterns 701, 702, and 704 may be configured to include at one side thereof an oscillator on the PCB.

FIG. 7C is a diagram illustrating the rear surface of the electronic device 700 in a state where the first and second housing parts 750 and 760 are folded by the connection part 770. According to one embodiment, as shown in FIG. 7C, the electronic device 700 may include at least one conductive member in each housing part.

Referring to FIG. 7C, the housing parts of the electronic device 700 may be bent or folded. For example, the first and second housing parts 750 and 760 may be bent or folded in the second direction 580b of FIG. 5A. The first housing part 750 may include the first conductive members 711, 712, and 714, and the second housing part 760 may include the second conductive members 715, 716, and 718. The first and second housing parts 750 and 760 may be electrically connected to each other as being bent or folded in the second direction 580b. When the first conductive members 711, 712, and 714 and the second conductive members 715, 716, and 718 are electrically connected, the first and second housing parts 750 and 760 may be electrically connected to each other. The first conductive members 711, 712, and 714 may be electrically connected to the first antenna patterns 701, 702, and 704, and the second conductive members 715, 716, and 718 may be electrically connected to the second antenna patterns 705, 706, and 708. As the first antenna patterns 701, 702, and 704 and the second antenna patterns 705, 706, and 708 are electrically connected to each other, it may operate as an antenna.

In one embodiment, the electrically connected antenna pattern may operate as an antenna. For example, the first antenna pattern 701 of the first housing part 750 may be electrically connected to the second antenna pattern 705 of the second housing part 760 by the first and second conductive members 711 and 715, thus operating as an antenna. In another embodiment, the first antenna pattern 702 of the first housing part 750 may be electrically connected to the second antenna pattern 706 of the second housing part 760 by the first and second conductive members 712 and 716, thus operating as an antenna. In still another embodiment, the first antenna pattern 704 of the first housing part 750 may be electrically connected to the second antenna pattern 708 of the second housing part 760 by the first and second conductive members 714 and 718, thus operating as an antenna. The antenna length may be adjusted as the second antenna patterns 705, 706, and 708 form at least partially the ground or are electrically connected to the ground.

According to various embodiments, as the first and second housing parts 750 and 760 are electrically connected to each other by the first and second conductive members 711, 712, 714, 715, 716, and 718, the parasitic resonance may be prevented. According to various embodiments, as the first antenna patterns 701, 702, and 704 and the second antenna patterns 705, 706, and 708 are electrically connected to each other, any unnecessary parasitic resonance may be prevented. Also, since the length of the antenna is increased through the electrical connection between the first antenna patterns 701, 702, and 704 and the second antenna patterns 705, 706, and 708, the shift of the resonance frequency of the antenna may be prevented.

In the above-described embodiments, the first antenna pattern and the second antenna pattern may be electrically connected to each other. For example, as the first and second housing parts 750 and 760 are electrically connected by the first and second conductive members 711, 712, 714, 715, 716, and 718, the first antenna patterns 701, 702, and 704 of the first housing part 750 and the second antenna patterns 705, 706, and 708 of the second housing part 760 may be electrically connected. When the first antenna patterns 701, 702, and 704 of the first housing part 750 and the second antenna patterns 705, 706, and 708 of the second housing part 760 are connected, the antenna length may be increased. If the antenna length is increased, the resonance frequency of the antenna 410 may be lowered.

Figure 8A:
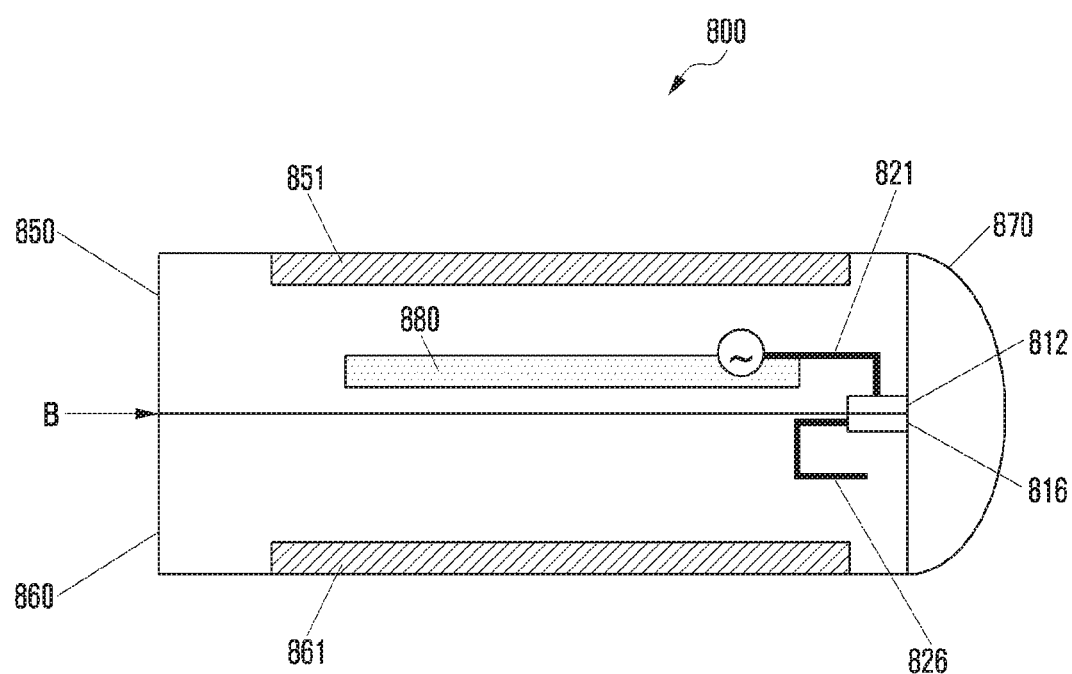
FIGS. 8A and 8B are cross-sectional views of an electronic device to illustrate a current flow according to various embodiments of the present disclosure.
Figure 8B:
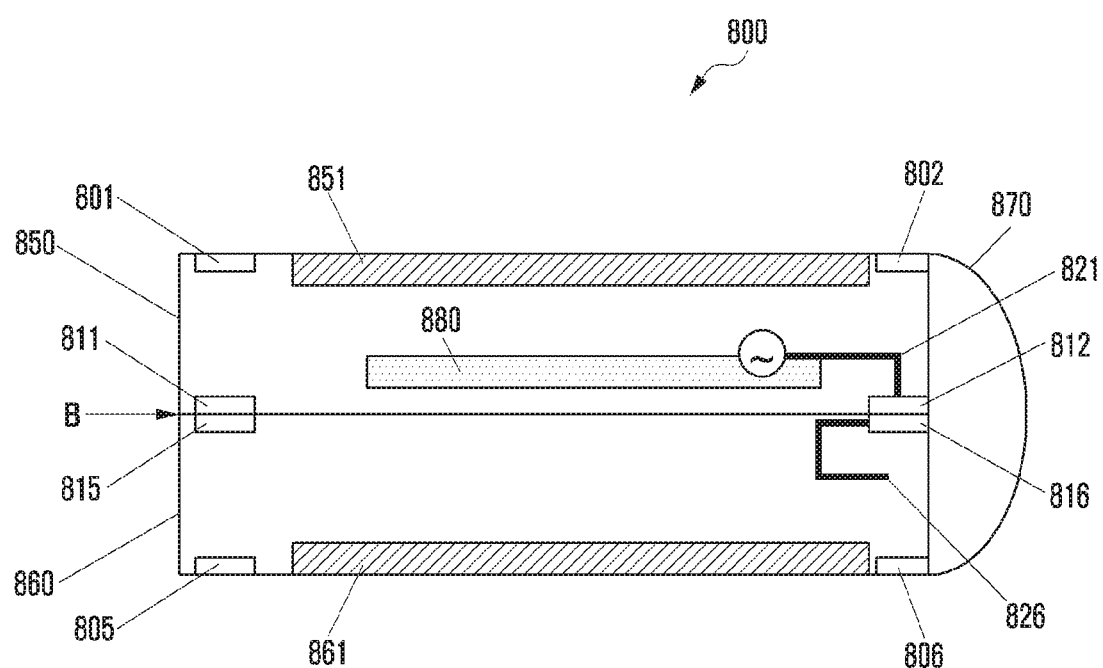

FIGS. 8A and 8B are cross-sectional views of an electronic device to illustrate a current flow according to various embodiments of the present disclosure.

Referring to FIG. 8A, in various embodiments, the electronic device 800 may include a conductive member (e.g., one) in each housing part.

In various embodiments, the first housing part 850 and the second housing part 860 may be folded in the second direction 580b. As the first and second housing parts 850 and 860 are folded in the second direction 580b, the first and second housing parts 850 and 860 may be in contact with each other on one surface B and be electrically connected to each other by the conductive member. The one surface B may be the second surface A-2 of the first housing part and the second surface B-2 of the second housing part as shown in FIG. 5A.

In various embodiments, the first housing part 850 may include the first conductive member 812, and the second housing part 860 may include the second conductive member 816. The first and second conductive members 812 and 816 may be a magnet, an electromagnet, a magnetized metal, a pogo-pin, a C-clip, a conductive connector, and a conductive male/female member. As the first and second housing parts 850 and 860 are folded in the second direction 580b, the first and second conductive members 812 and 816 of the surface B may be electrically connected to each other.

According to various embodiments, the first housing part 850 may include a conductive member other than the first conductive member 812, and some or all of the conductive members of the first housing part 850 may be connected to the antenna pattern. For example, the first conductive member 812 of the first housing part 850 may be electrically connected to the first antenna pattern 821. For example, the second conductive member 816 of the second housing part 860 may be electrically connected to the second antenna pattern 826. For example, the first and second antenna patterns 821 and 826 may be a GPS antenna, a Wi-Fi antenna, an LTE antenna, or a diversity antenna.

Referring to FIG. 8B, the first housing part 850 may include the first display 851. The second housing part 860 may include the second display 861. In various embodiments, FIG. 8B shows an example of the electronic device that includes a dual display. In various embodiments, the electronic device 800 may include a plurality of conductive members inside each housing part.

In various embodiments, the first housing part 850 may include the PCB 880 therein. The first housing part 850 may include therein the first antenna pattern 821, which may be mounted on the PCB 880 in the housing. The second housing part 860 may include therein the second antenna pattern 826.

In various embodiments, the first housing part 850 and the second housing part 860 may be folded in the second direction 580b. As the first and second housing parts 850 and 860 are folded in the second direction 580b, the first and second housing parts 850 and 860 may be in contact with each other on one surface B and be electrically connected to each other by the conductive member. The one surface B may be the second surface A-2 and B-2 as shown in FIG. 5A.

In various embodiments, as the first and second housing parts 850 and 860 are folded in the second direction 580b, the first and second conductive members 811, 812, 815, and 816 of the surface B may be electrically connected to each other. The first housing part 850 may include the first conductive members 811 and 812, and the second housing part 860 may include the second conductive members 815 and 816. The first and second conductive members 811, 812, 815, and 816 may be a magnet, an electromagnet, a magnetized metal, a pogo-pin, a C-clip, a conductive connector, and a conductive male/female member.

According to various embodiments, the first housing part 850 may include a conductive member other than the first conductive members 811 and 812, and some or all of the conductive members of the first housing part 850 may be connected to the antenna pattern.

For example, the first conductive member 812 of the first housing part 850 may be electrically connected to the first antenna pattern 821. For example, the second conductive member 816 of the second housing part 860 may be electrically connected to the second antenna pattern 826. For example, the first and second antenna patterns 821 and 826 may be a GPS antenna, a Wi-Fi antenna, an LTE antenna, or a diversity antenna.

According to various embodiments, an electronic device may comprise a foldable housing including a first housing part including a first surface and a second surface opposite to the first surface, a second housing part including a first surface facing the first surface of the first housing part when folded in a first direction, and a second surface facing the second surface of the first housing part when folded in a second direction, and a connection part connecting the first housing part and the second housing part; a communication circuit disposed inside the housing; a first antenna pattern disposed inside the first housing part; a second antenna pattern disposed inside the second housing part; a first display exposed to the first surface of the first housing part; a second display exposed to the first surface of the second housing part; a first conductive member exposed to the second surface of the first housing part, and electrically connected to the first antenna pattern; and a second conductive member exposed to the second surface of the second housing part, and electrically connected to the second antenna pattern, wherein the communication circuit is electrically connected to the first antenna pattern and/or the second antenna pattern, and wherein the first conductive member and the second conductive member are electrically connected to or coupling with each other when the housing is folded in the second direction.

According to various embodiments, the first conductive member or the second conductive member may include a magnetic material or a material attracted by a magnet, and may be at least one of a magnet, a pogo-pin, a C-clip, and a conductive connector.

According to various embodiments, the communication circuit may be electrically connected to one of the first antenna pattern and the second antenna pattern.

According to various embodiments, the electronic device may further comprise at least one ground member, wherein the at least one ground member may be electrically connected to one of the first antenna pattern and the second antenna pattern.

According to various embodiments, the second antenna pattern may be electrically connected to the ground member or is a portion of the ground member.

According to various embodiments, an electrical length of the first antenna pattern and/or the second antenna pattern may be increased as the first antenna pattern and/or the second antenna pattern are electrically connected.

According to various embodiments, when the housing is folded in the second direction and an electric current is supplied to the first antenna pattern, the electric current may flow to the second antenna pattern through the first conductive member and the second conductive member.

According to various embodiments, when the housing is folded in the second direction, the first antenna pattern and the second antenna pattern may be electrically connected through the first conductive member and the second conductive member.

According to various embodiments, the second conductive member may have at least one of shapes including text, image, symbol, mark, and number.

According to various embodiments, the connection part may have a shape of hinge, and the first housing part and the second housing part may be folded in the first direction or the second direction by the connection part.

According to various embodiments, an electronic device may comprise a housing including a first surface and a second surface opposite to the first surface; a communication circuit disposed inside the housing; at least one first conductive member exposed to a portion of the second surface of the housing; at least one second conductive member exposed to another portion of the second surface of the housing; a first antenna pattern disposed inside the housing and electrically connected to the first conductive member; and a second antenna pattern disposed inside the housing and electrically connected to the second conductive member, wherein the communication circuit is electrically connected to the first antenna pattern and/or the second antenna pattern, wherein when folded in a first direction, at least a portion of the first surface meets at least another portion of the first surface, and wherein when folded in a second direction, at least a portion of the second surface meets at least another portion of the second surface, and the first conductive member and the second conductive member are electrically connected to or coupling with each other.

According to various embodiments, the housing may be at least one of a dual display, a flip cover, and a flexible display.

According to various embodiments, the electronic device may further comprise a connection part connecting the portion of the first surface of the housing and at least another portion of the first surface.

According to various embodiments, the electronic device may further comprise a display exposed to the first surface of the housing.

According to various embodiments, the first conductive member or the second conductive member may include a magnetic material or a material attracted by a magnet, and may be at least one of a magnet, a pogo-pin, a C-clip, and a conductive connector.

According to various embodiments, the communication circuit may be electrically connected to one of the first antenna pattern and the second antenna pattern.

According to various embodiments, the electronic device may further comprise at least one ground member, and the at least one ground member may be electrically connected to one of the first antenna pattern and the second antenna pattern.

According to various embodiments, the second antenna pattern may be electrically connected to the ground member or is a portion of the ground member.

According to various embodiments, when the housing is folded in the second direction, the first antenna pattern and the second antenna pattern may be electrically connected through the first conductive member and the second conductive member.

According to various embodiments, the second conductive member may have at least one of shapes including text, image, symbol, mark, and number.

While the present disclosure has been shown and described with reference to various embodiments thereof, it will be understood by those skilled in the art that various changes in form and details may be made therein without departing from the subject matter and scope of the present disclosure as defined by the appended claims and their equivalents.

The invention claimed is:
1. An electronic device comprising:
  a housing including:
    a first housing part including a first surface and a second surface opposite to the first surface,
    a second housing part including a first surface facing the first surface of the first housing part when folded in a first direction, and a second surface facing the second surface of the first housing part when folded in a second direction, and
    a connection part connecting the first housing part and the second housing part;
  a communication circuit disposed inside the housing;

a first antenna pattern disposed inside the first housing part;

a second antenna pattern disposed inside the second housing part;

a first display exposed to the first surface of the first housing part;

a second display exposed to the first surface of the second housing part;

a first conductive member exposed to the second surface of the first housing part, and electrically connected to the first antenna pattern; and a second conductive member exposed to the second surface of the second housing part, and electrically connected to the second antenna pattern, wherein the communication circuit is electrically connected to at least one of the first antenna pattern and the second antenna pattern, and wherein, when the housing is folded in the second direction, the second surface of the first housing directly contacts the second surface of the second housing to electrically connect or couple the first conductive member and the second conductive member with each other.

2. The electronic device of claim 1, wherein an electrical length of at least one of the first antenna pattern and the second antenna pattern is increased as at least one of the first antenna pattern and the second antenna pattern are electrically connected.

3. The electronic device of claim 1, wherein when the housing is folded in the second direction and an electric current is supplied to the first antenna pattern, the electric current flows to the second antenna pattern through the first conductive member and the second conductive member.

4. The electronic device of claim 1, wherein when the housing is folded in the second direction, the first antenna pattern and the second antenna pattern are electrically connected through the first conductive member and the second conductive member.

5. The electronic device of claim 1, wherein the second conductive member is shaped as at least one of a text, an image, a symbol, a mark, and a number.

6. The electronic device of claim 1, wherein the connection part has a shape of hinge, and wherein the first housing part and the second housing part are folded in the first direction or the second direction by the connection part.

7. The electronic device of claim 1, wherein the first conductive member or the second conductive member includes a magnetic material or a material attracted by a magnet, and wherein the first conductive member or the second conductive member is at least one of a magnet, a pogo-pin, a C-clip, and a conductive connector.

8. The electronic device of claim 1, wherein the communication circuit is electrically connected to one of the first antenna pattern and the second antenna pattern.

9. The electronic device of claim 1, further comprising:

at least one ground member, wherein the at least one ground member is electrically connected to one of the first antenna pattern and the second antenna pattern.

10. An electronic device comprising:

a housing including a first surface and a second surface opposite to the first surface;

a communication circuit disposed inside the housing;

at least one first conductive member exposed to a portion of the second surface of the housing;

at least one second conductive member exposed to another portion of the second surface of the housing;

a first antenna pattern disposed inside the housing and electrically connected to the first conductive member; and a second antenna pattern disposed inside the housing and electrically connected to the second conductive member, wherein the communication circuit is electrically connected to at least one of the first antenna pattern and the second antenna pattern, wherein when the housing is folded in a first direction, at least a portion of the first surface comes into contact with at least another portion of the first surface, and wherein when the housing is folded in a second direction, a portion of the second surface directly contacts at least another portion of the second surface, to electrically connect or couple the portion of the second and the at least another portion of the second surface.

11. The electronic device of claim 10, wherein the housing is at least one of a dual display, a flip cover, and a flexible display.

12. The electronic device of claim 10, further comprising:

a connection part connecting the portion of the first surface of the housing and at least another portion of the first surface.

13. The electronic device of claim 10, wherein the first conductive member or the second conductive member includes a magnetic material or a material attracted by a magnet, and wherein the first conductive member or the second conductive member is at least one of a magnet, a pogo-pin, a C-clip, and a conductive connector.

14. The electronic device of claim 10, wherein the communication circuit is electrically connected to one of the first antenna pattern and the second antenna pattern.

15. The electronic device of claim 10, further comprising:

at least one ground member, wherein the at least one ground member is electrically connected to one of the first antenna pattern and the second antenna pattern.

16. The electronic device of claim 15, wherein the second antenna pattern is electrically connected to the ground member or is a portion of the ground member.

17. The electronic device of claim 10, wherein when the housing is folded in the second direction, the first antenna pattern and the second antenna pattern are electrically connected through the first conductive member and the second conductive member.

18. The electronic device of claim 10, wherein the second conductive member is shaped as at least one of a text, an image, a symbol, a mark, and a number.

* * * * *